(12) United States Patent
Hazeyama et al.

(10) Patent No.: US 6,889,886 B2
(45) Date of Patent: May 10, 2005

(54) TRANSFER APPARATUS FOR ARRAYING SMALL CONDUCTIVE BUMPS ON SUBSTRATE AND/ OR CHIP

(75) Inventors: Ichiro Hazeyama, Tokyo (JP); Sakae Kitajo, Tokyo (JP); Yuzo Shimada, Tokyo (JP); Akeo Katahira, Shizuoka (JP); Jun Ishida, Shizuoka (JP); Masaru Terashima, Shizuoka (JP); Kazuhiko Futakami, Shizuoka (JP)

(73) Assignees: NEC Corporation, Tokyo (JP); Japan E.M. Co., LTD., Shizuoka (JP)

( * ) Notice: Subject to any disclaimer, the term of this patent is extended or adjusted under 35 U.S.C. 154(b) by 93 days.

(21) Appl. No.: 10/105,580

(22) Filed: Mar. 25, 2002

(65) Prior Publication Data

US 2002/0135064 A1 Sep. 26, 2002

(30) Foreign Application Priority Data

Mar. 26, 2001 (JP) ........................... 2001-087643

(51) Int. Cl.[7] ................. B23K 37/06; B23K 20/14; B23K 35/12
(52) U.S. Cl. .................. 228/39; 228/180.22; 228/246
(58) Field of Search ........................ 228/41, 33, 336, 228/39, 40, 246, 180.22, 180.21, 47.1, 49.5, 36

(56) References Cited

U.S. PATENT DOCUMENTS

| | | | | |
|---|---|---|---|---|
| 5,284,287 A | * | 2/1994 | Wilson et al. | 228/180.22 |
| 5,609,292 A | * | 3/1997 | Kohn | 228/246 |
| 5,831,247 A | * | 11/1998 | Hidaka | 219/388 |
| 5,976,965 A | * | 11/1999 | Takahashi et al. | 438/616 |
| 6,270,002 B1 | * | 8/2001 | Hayashi et al. | 228/246 |
| 6,378,756 B1 | * | 4/2002 | Takahashi et al. | 228/159 |
| 6,422,452 B2 | * | 7/2002 | Yamamoto et al. | 228/246 |
| 6,460,755 B1 | * | 10/2002 | Inoue et al. | 228/246 |
| 6,533,160 B1 | * | 3/2003 | Bourrieres et al. | 228/41 |
| 6,641,030 B1 | * | 11/2003 | Freeman et al. | 228/246 |
| 2003/0127501 A1 | * | 7/2003 | Cheng et al. | 228/246 |

FOREIGN PATENT DOCUMENTS

| | | | |
|---|---|---|---|
| CN | 460355 | | 10/2001 |
| JP | 08-330312 A | * | 12/1996 |
| JP | 11-087900 A | * | 3/1999 |
| JP | 2001-135660 | | 5/2001 |
| JP | 2001-135660 A | * | 5/2001 |
| WO | WO 98/36451 | * | 8/1998 |

OTHER PUBLICATIONS

English Version of China Patent Publication No. 460355 (publication date: Oct. 21, 2001).

* cited by examiner

Primary Examiner—L. Edmondson
(74) Attorney, Agent, or Firm—Choate, Hall & Stewart

(57) ABSTRACT

Conductive balls are transferred from a pallet onto an array of conductive pads on a semiconductor chip by means of a transfer apparatus; the transfer apparatus includes a pallet formed with an array of recesses same in pattern as the array of conductive pads, a movable head formed with an array of vacuum holes and a driving mechanism for moving the head from an idle position onto the pallet and from the pallet to the semiconductor chip; when the head is moved to the pallet, the vacuum holes are connected to the recesses so as to confine the conductive balls in the narrow spaces; the vacuum is developed; then the conductive balls are traveled through the closed spaces to the vacuum holes; even if the conductive balls have been charged, the conductive balls are never attracted to the adjacent balls, and are surely captured by the vacuum holes.

30 Claims, 15 Drawing Sheets

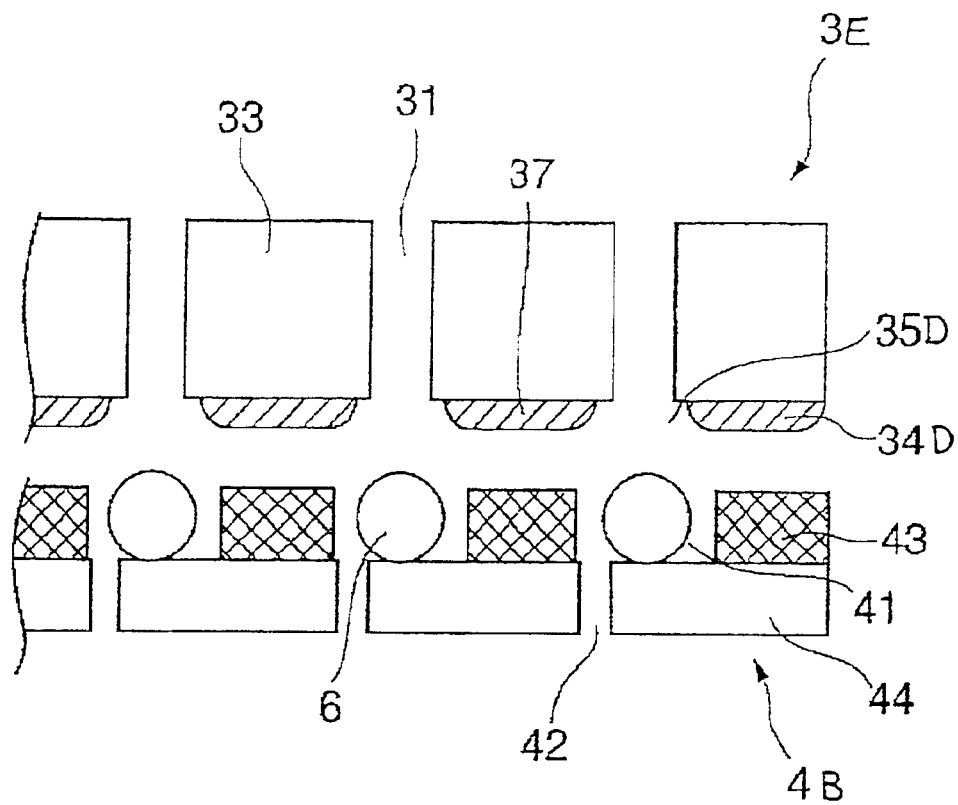
Fig. 1 2 A
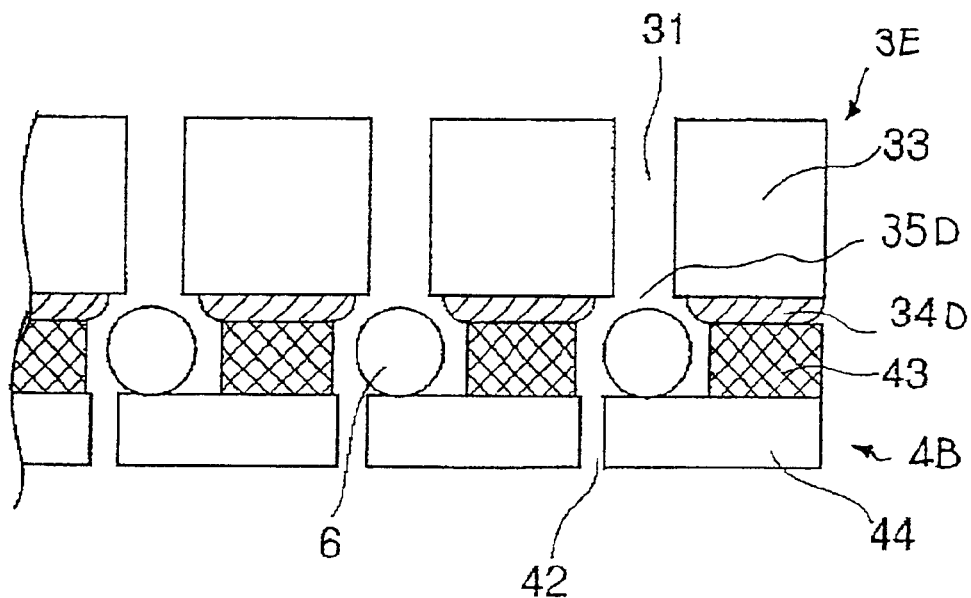
Fig. 1 2 B

TRANSFER APPARATUS FOR ARRAYING SMALL CONDUCTIVE BUMPS ON SUBSTRATE AND/ OR CHIP

FIELD OF THE INVENTION

This invention relates to an assembling technology for electric components and, more particularly, to a transfer apparatus for arraying conductive bumps on a semiconductor chip and a package.

DESCRIPTION OF THE RELATED ART

Flip chip packages, chip size packages, i.e., CSP and ball grid array packages, i.e., BGA require arrays of solder balls. Conventionally, the solder balls are arrayed on a package or semiconductor chip by means of a transfer apparatus. A typical example of the transfer apparatus has a vacuum pad, a driving mechanism and an evacuation system. The vacuum pad is formed with an array of recesses, and the evacuation system is connected to the recesses. The array of recesses was formed in the pad through an etching or an electroforming.

First, the driving mechanism moves the vacuum pad to solder balls, and the evacuation system makes the vacuum developed in the array of recesses. The solder balls are attracted to the array of recesses, and are arrayed on the vacuum pad. The driving mechanism moves the vacuum pad to a package or semiconductor chip together with the solder balls. When array of the solder balls is aligned with the conductive pads of the package or semiconductor chip, the evacuation system breaks the vacuum so as to put the solder balls on the conductive pads.

The solder balls are usually randomly stored, and are arrayed on the vacuum pad when they are attracted into the recesses. However, the vacuum pad sometimes fails to attract the solder balls into all of the recesses. A solution was proposed by the applicants, and is disclosed in Japanese Patent Application No. 11-311866. The contents of Japanese Patent Application No. 11-311866 was published on May 18, 2001 as Japanese Patent Application laid-open No. 2001-135660. In the specification for the Japanese Patent Application, the solder balls are stored in a pallet. The pallet has an array of recesses, and the recesses are arrayed as similar to the array of recesses formed in the vacuum pad. When the solder balls are to be transferred to a package or semiconductor chip, the driving mechanism moves the vacuum pad to the pallet, and aligns the recesses with the solder balls stored in the array of recesses formed in the pallet. Thereafter, the evacuation system causes the solder balls to be attracted to the vacuum pad. The solder balls are arrayed in the pallet before the attraction to the vacuum pad. The array of solder balls is only transferred from the pallet to the vacuum pad, and the vacuum pad surely receives an array of solder balls from the pallet.

The integration density of circuit components in a semiconductor chip has been gotten higher and higher. A large number of conductive bumps are presently required for the interface between a semiconductor chip and a circuit board. In order to array a large number of solder balls on the premise that the package or semiconductor chip is not enlarged, the solder balls are to be reduced in size. However, the small solder balls are liable to be stuck in the recesses. Even though the vacuum is developed in the recesses, the small solder balls are hardly attracted to the vacuum pad. If the vacuum is strongly developed, the small solder balls are separated from the pallet, and are attracted to the pad. However, the small solder balls rebound on the bottom surfaces defining the recesses in the vacuum pad. The vacuum pad fails to catch the small solder balls.

The specification for the Japanese Patent Application further teaches a pallet with gas blowing nozzles. The gas blowing nozzles are open to the bottom surface defining the recesses in the pallet. The gas blowing nozzles are effective against the relatively large solder balls stuck in the recesses. When the pallet is used for arraying small solder balls, the operator feels the adjustment of gas pressure difficult. If the gas pressure is weak, the small solder balls are hardly separated from the pallet. On the other hand, if the gas pressure is too strong, the small solder balls are deformed at the collision with the vacuum pad.

The vacuum pad further fails to catch the small solder balls due to static charge. In order to array the small solder balls at high density in the pallet, the small recesses are formed in the pallet at small intervals. The small solder balls are charged due to friction before they are arrayed in the pallet. When the vacuum is developed in the vacuum pad, the array of small solder balls is moved toward the vacuum pad. While the small solder balls are traveling from the pallet to the vacuum pad, some small solder balls deviate from the orbits between the pallet and the vacuum pad due to the static charge. The vacuum pad fails to catch the small solder balls.

SUMMARY OF THE INVENTION

It is therefore an important object of the present invention to provide a transfer apparatus, which exactly transfers small bumps from a pallet to a movable pad.

To accomplish the object, the present invention proposes to physically separate the paths for guiding conductive bumps from an array station to a sucking head.

In accordance with one aspect of the present invention, there is provided a transfer apparatus for transferring conductive bumps to an array of conductive pads on a substrate comprising a sucking head having plural vacuum holes laid on a pattern same as a pattern of the array of conductive pads, a vacuum source developing vacuum in the plural vacuum holes and breaking the vacuum, an array station having a pallet formed with plural recesses laid on the pattern of the array of conductive pads and receiving the conductive bumps, respectively, and a driving mechanism moving the sucking head to the pallet so as to form paths physically separated from one another for guiding the conductive bumps from the plural recesses to the plural vacuum holes and further moving the sucking head from the pallet to the array of conductive pads.

BRIEF DESCRIPTION OF THE DRAWINGS

The features and advantages of the transfer apparatus will be more clearly understood from the following description taken in conjunction with the accompanying drawings, in which FIGS. 12A and 12B are cross sectional views showing yet another vacuum pad employable in the transfer apparatus.

DESCRIPTION OF THE PREFERRED EMBODIMENTS

First Embodiment

Figure 1:
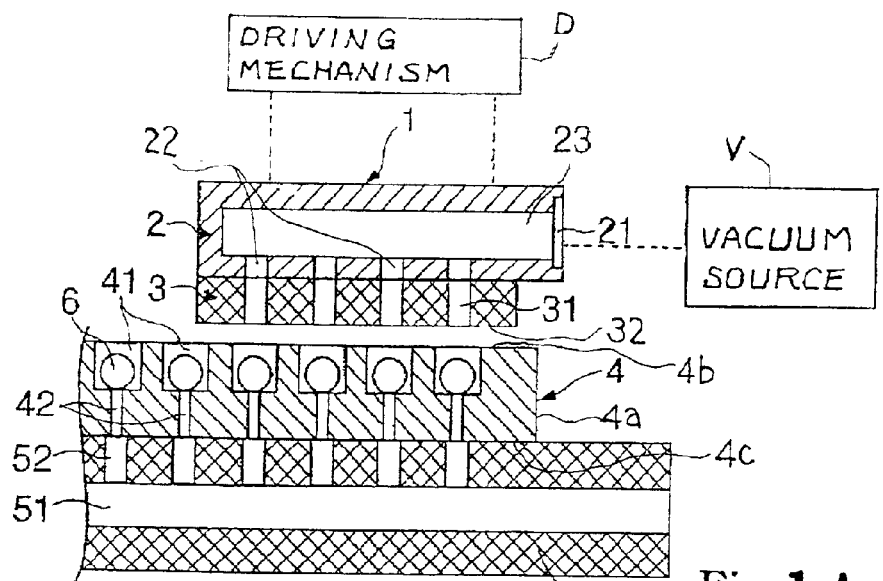
FIGS. 1A to 1C are cross sectional views showing a transfer apparatus in a ball transfer operation.
Figure 1:
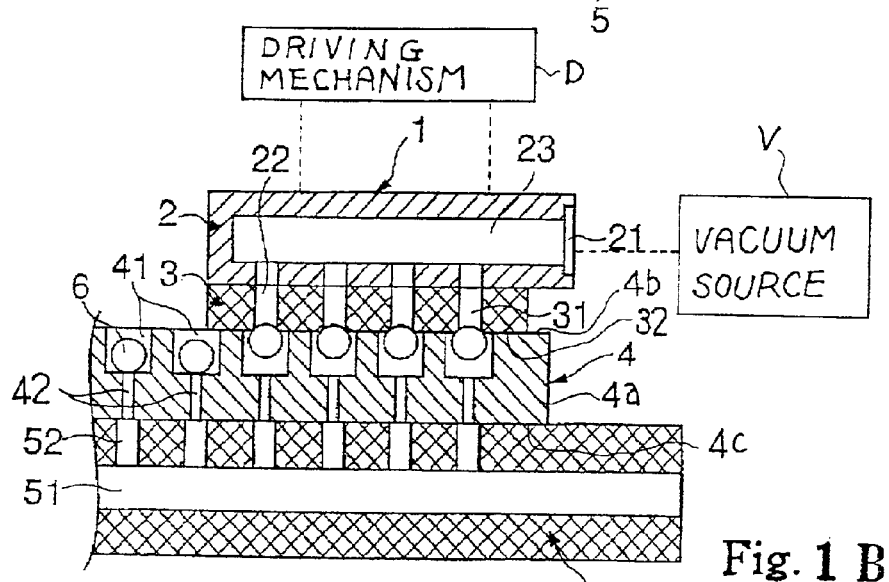
Figure 1:
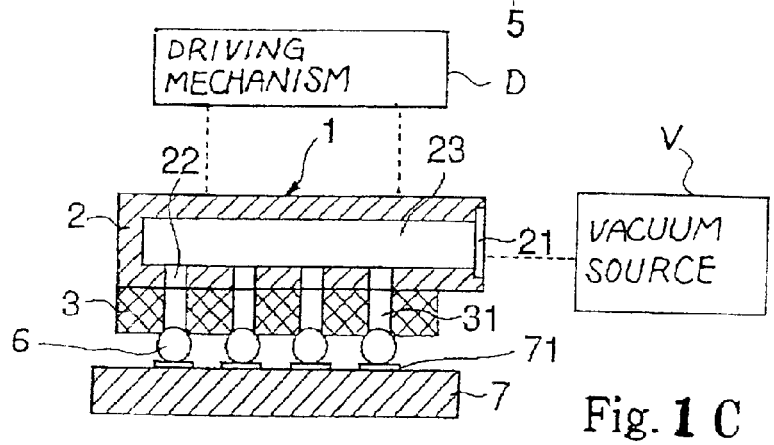

Referring to FIGS. 1A to 1C of the drawings, a transfer apparatus embodying the present invention largely comprises a sucking head 1, an array station 4, a driving mechanism D and a vacuum source V. Conductive balls 6 such as, for example, solder balls are arrayed in the array station 4. The driving mechanism D is connected to the sucking head 1 so as to move the sucking head 1 between a catching position and a releasing position, and the vacuum source V is also connected to the sucking head 1 so as to develop vacuum in the sucking head 1 and break the vacuum (see FIG. 1A).

When the sucking head 1 is moved to the catching position, the sucking head 1 is brought into surface-to-surface contact with the array station 4, and the conductive balls 6 are separated from one another by means of walls of the sucking head 1 (see FIG. 1B). The vacuum source V develops vacuum in the sucking head 1, and the conductive balls 6 are attracted to the sucking head 1 without deviation from the transfer paths defined by the walls. The sucking head 1 is moved to the releasing position over a semiconductor chip 7, and the conductive balls 6 are aligned with conductive pads 71 arrayed on the semiconductor chip 7. The vacuum is broken. Then, the conductive balls 6 are transferred to the conductive pads 71 on the semiconductor chip 7 (see FIG. 1C). Thus, the conductive balls 6 are transferred from the array station 4 to the semiconductor chip 7.

The sucking head 1 includes a manifold 2 and a vacuum pad 3. The vacuum pad 3 is detachably connected to the manifold 2. A hollow space 23 is formed in the manifold 2, and the vacuum source V is connected through an inlet port 21 to the hollow space 23. Plural holes 22 are further formed in the manifold 2, and are connected to the hollow space 23. The vacuum pad 3 is formed with plural holes 31, and the plural holes 31 are opened to a flat surface 32 of the vacuum pad 3. The holes 31 are laid on the pattern same as the conductive pads 71 on the semiconductor chip 7. When the vacuum pad 3 is assembled with the manifold 2, the holes 31 are respectively aligned with the holes 22, because the plural holes 22 are also laid on the pattern same as the conductive pads 71 on the semiconductor chip 7.

When the vacuum source V evacuates the air from the hollow space 23, vacuum is developed in the plural holes 31, and the air is sucked through the plural holes 31. In this instance, the plural holes 31 are formed in the manifold 2, and the holes 31 are respectively connected to the holes 22. The holes 31 may be connected to the hollow space 23 through only one hole or plural holes different in number from the holes 31. If the conductive balls 6 are transferred onto conductive pads differently arranged on a semiconductor chip or package, the vacuum pad 3 is replaced with another vacuum pad formed with holes corresponding to the conductive pads.

On the other hand, the array station 4 includes a pallet 4a and a manifold 5. The pallet 4a is formed with plural recesses 41, which are open to an upper flat surface 4b of the pallet 4a. Holes 42 are further formed in the pallet 4, and are open to the bottom surfaces of the recesses 41. The recesses 41 are slightly larger in diameter than the conductive balls 6 so as to receive the conductive balls 6. However, the holes 42 are smaller in diameter than the conductive balls 6, and the conductive balls 6 are never dropped into the holes 42. The holes 42 pass through the pallet 4a, and reach the lower surface 4c of the pallet 4a.

The recesses 41 are laid on the pattern same as the conductive pads 71 on the semiconductor chip 7. When the conductive balls 6 are put into the recesses 41, the conductive balls 6 are automatically arrayed on the pattern same as the conductive pads 71 on the semiconductor chip 7.

The manifold 5 is formed with a hollow space 51, which is open to the air. Plural holes 52 are further formed in the manifold 5, and are open to the upper surface of the manifold 5. The holes 52 are connected to the hollow space 51 so that the atmospheric pressure reaches the holes 52. The holes 52 are also laid on the pattern same as the conductive pads 71 on the semiconductor chip 7. When the pallet 4 is assembled with the manifold 5, the hollow space 51 is connected through the holes 52 and 42 to the recesses 41. The hollow space 51 may be connected to the holes 42 through only one hole or plural holes different in number from the holes 42.

The vacuum pad 2 and pallet 3 are formed from silicon wafers, metal/alloy plates, glass plates, ceramic plates or synthetic resin plates. A photo-resist etching mask (not show) is patterned on the plate through a photolithography, and the plate is selectively removed by using an etching. Namely, the holes 31/42 and recesses 41 are formed by using the photolithography and etching.

The transfer apparatus behaves as follows. First, the conductive balls 6 are put into the recesses 41 of the pallet 4a so as to be arrayed on the pattern same as the conductive pads 71. The driving mechanism D keeps the sucking head 1 over the catching position. The conductive balls 6 arrayed in the pallet 4a are conveyed to the manifold 5, and the holes 42 are aligned with the holes 52 as shown in FIG. 1A. The air fills the hollow space 51, holes 52/42 and the recesses 41.

Subsequently, the driving mechanism D moves the sucking head 1 downwardly. The flat surface 32 is brought into surface-to-surface contact with the upper surface 4b of the pallet 4a, and the holes 22 are respectively connected to the recesses 41. Thus, the conductive balls 6 are confined in the narrow spaces, i.e., the recesses 41, respectively. The walls, which define the recesses 41, isolate the conductive balls from one another, and make the narrow spaces independent of one another. The narrow spaces offer transfer paths to the conductive balls 6, and the walls do not permit the conductive balls 6 to deviate form the transfer paths.

Subsequently, the vacuum source V is connected to the hollow space 23, and, accordingly, vacuum is developed through the holes 22, 31 in the recesses 41. The conductive balls 6 are attracted to the vacuum pad 3, and are captured by the vacuum pad 3 as shown in FIG. 1B. The air is sucked through the hollow space 51, holes 52/42 and the recesses 41, and, accordingly, the differential pressure is effectively exerted on the conductive balls 6. Even if electrostatic force is exerted on the adjacent conductive balls 6, the conductive balls 6 never deviate from the transfer paths. For this reason, the conductive balls 6 are surely captured by the vacuum pad 3.

The driving mechanism D lifts the sucking head 1 over the array station 4, and moves the sucking head 1 to the space over the semiconductor chip 7 together with the conductive balls 6. The driving mechanism D makes the conductive balls 6 aligned with the conductive pads 71, and moves the sucking head 1 downwardly. The conductive balls 6 are brought into contact with the conductive pads 71, respectively. The vacuum is broken. Then, the conductive balls 6 are released from the vacuum pad 3, and are connected to the conductive pads 71, respectively.

In case where the conductive balls 6 are formed of solder, the vacuum pad 3 may be separated from the manifold 2 together with the solder balls 6. The vacuum pad 3 is moved into a reflow furnace together with the silicon chip 7 and the solder balls 6. The solder balls 6 are partially melted so as to be adhered to the conductive pads 71. After the semiconductor chip 7 is taken out from the reflow furnace, the vacuum head 3 is removed from the solder balls 6.

As will be understood from the foregoing description, the sucking head 1 and array station 4 confine the conductive balls 6 in the narrow spaces, i.e., the recesses 41 physically separated from one another, and the vacuum source V effectively develops vacuum in the narrow spaces 41. The conductive balls 6 are effectively attracted to the sucking head without deviation from the narrow spaces 41, and are surely captured by the sucking head 1. Even if the conductive balls 6 are charged, the sucking head 1 and the array station 4 prevent the conductive ball from the influences of the adjacent conductive balls 6. Thus, the conductive balls 6 are surely captured by the sucking head 1.

Second Embodiment

Figure 2:
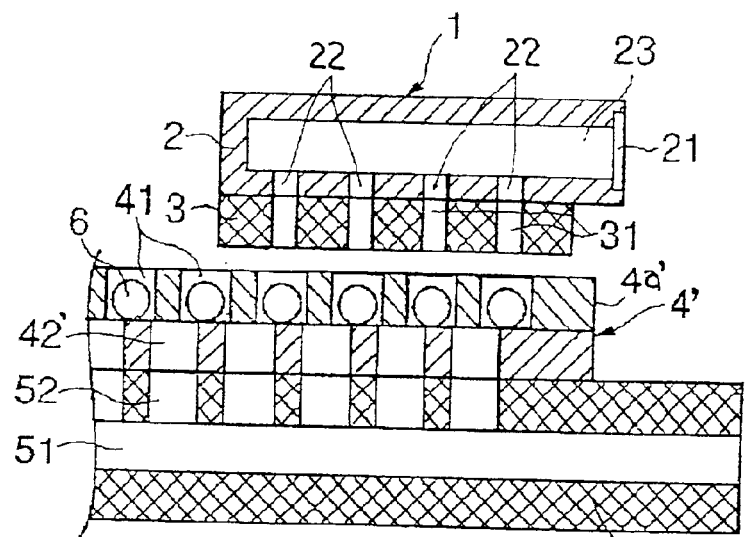
FIGS. 2A to 2C are cross sectional views showing another transfer apparatus in a ball transfer operation.
Figure 2:
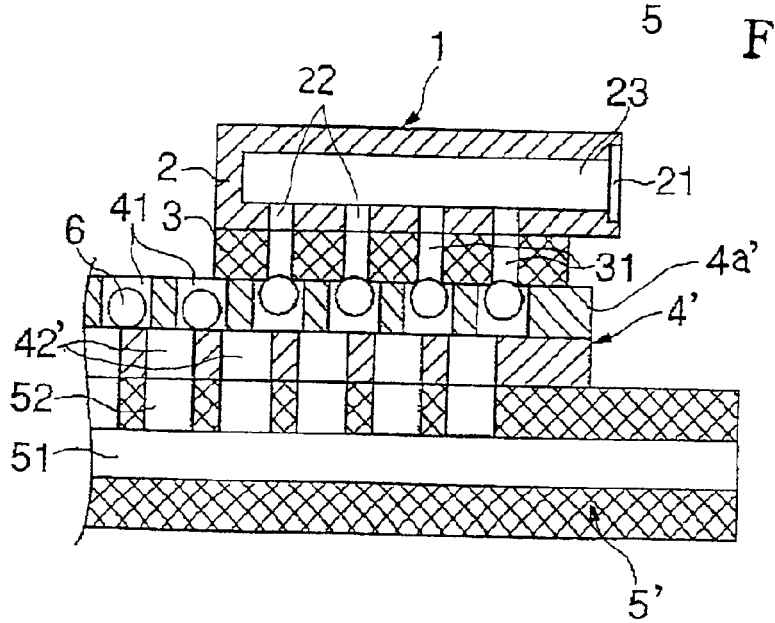
Figure 2:
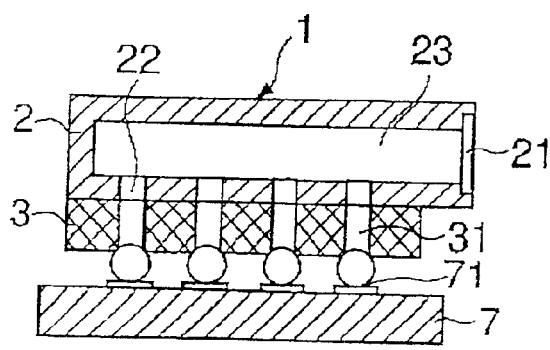

Turning to FIGS. 2A to 2C of the drawings, another transfer apparatus embodying the present invention largely comprises largely comprises a sucking head 1, an array station 4', a driving mechanism (not shown) and a vacuum source (not shown). The transfer apparatus implementing the second embodiment is similar to the transfer apparatus shown in FIGS. 1A to 1C except the array station 4'. The sucking head 1, driving mechanism and the vacuum source are same as those of the first embodiment, and, for this reason, component parts are labeled with the references designating corresponding component parts of the first embodiment without detailed description.

The array station 4' also includes a pallet 4a' and a manifold 5'. Although the manifold 5' is similar to the manifold 5, the pallet 4a' is different from the pallet 4a. The pallet 4a' is also formed with plural recesses 41, which are open to an upper flat surface of the pallet 4a'. The recesses 41 are laid on the pattern same as the conductive pads 71 on the semiconductor chip 7, and are to be aligned with the holes 31 formed in the vacuum pad 3. When the conductive balls 6 are put into the recesses 41, the conductive balls 6 are automatically arrayed on the pattern same as the conductive pads 71.

Holes 42' are further formed in the pallet 4', and are open to the bottom surfaces of the recesses 41. The recesses 41 are slightly larger in diameter than the conductive balls 6 so as to receive the conductive balls 6. However, the holes 42' are smaller in diameter than the conductive balls 6, and the conductive balls 6 are never dropped into the holes 42'. The holes 42' pass through the pallet 4a, and reaches the lower surface of the pallet 4a'. The holes 42' have centerlines, respectively, and the recesses 41 also have centerlines, respectively. Although the centerlines of the holes 42 are coincident with the centerlines of the recesses 41 in the first embodiment, the centerlines of the holes 42' are offset from the centerlines of the recesses 41. In other words, the holes 42' are not open to the central areas of the bottom surfaces of the recesses 41. When the pallet 4a' is moved to the manifold 5', the holes 42' are respectively aligned with the holes 52 formed in the manifold 5. However, the air passages 52/42' are not aligned with the recesses 41.

The transfer apparatus implementing the second embodiment behaves as follows. First, the conductive balls 6 are put into the recesses 41 of the pallet 4a' so as to be automatically arrayed on the pattern same as the conductive pads 71. In the first embodiment, the conductive balls 6 may clog the holes 42, because the holes 42 are open to the central areas of the bottom surfaces of the recesses 41. However, the holes 42' are open to the peripheral area of the bottom surfaces. This means that the spherical surface is spaced from the holes 42'.

The driving mechanism keeps the sucking head 1 over the catching position. The conductive balls 6 arrayed in the pallet 4a' are conveyed to the manifold 5', and the holes 42' are aligned with the holes 52'. However, the conductive balls 6 in the recesses 41 are offset from the air passages 42/42' as shown in FIG. 2A. The air fills the hollow space 51, holes 52/42' and the recesses 41.

Subsequently, the driving mechanism moves the sucking head 1 downwardly. The sucking head 1 is brought into surface-to-surface contact with the pallet 4a', and the holes 22 are respectively connected to the recesses 41. Thus, the conductive balls 6 are confined in the narrow spaces or recesses 41, respectively. The recesses 41 are independent of one another, and the walls, which define the recesses 41, isolates the conductive balls 6 from one another.

Figure 3:
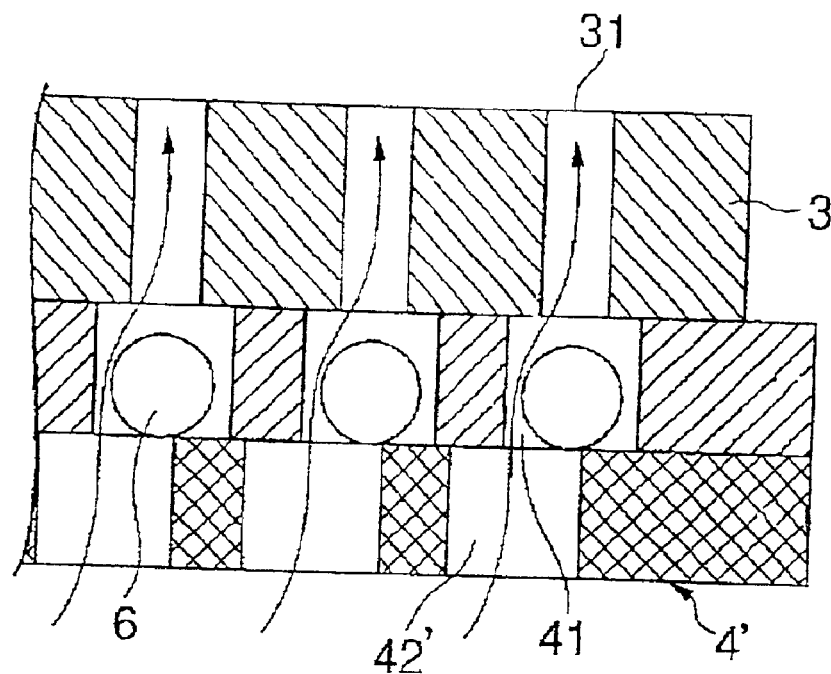
FIG. 3 is a cross sectional view showing airflow in a pallet incorporated in the transfer apparatus.

Subsequently, the vacuum source is connected to the hollow space 23, and, accordingly, vacuum is developed through the holes 22/31 in the recesses 41. The conductive balls 6 are attracted to the vacuum pad 3, and are captured by the vacuum pad 3 as shown in FIG. 2B. The air is sucked through the hollow space 51, holes 52/42' and the recesses 41, and, accordingly, the differential pressure is effectively exerted on the conductive balls 6. Moreover, the air surely flows through the space between the holes 42' and the spherical surfaces as shown in FIG. 3. The air pushes the conductive balls 6 sideward, and makes the conductive balls 6 float over the holes 42'. The conductive balls 6 are lifted along the walls, and are surely captured by the vacuum pad 3. Even if the conductive ball or balls 6 are adhered to the surfaces defining the recesses 41, the conductive ball or balls 6 are separated from the surfaces by virtue of the air pressure sideward exerted on the ball or balls. Thus, the conductive balls 6 are lifted toward the vacuum pad 3. Even if electrostatic force is exerted on the adjacent conductive balls 6, the conductive balls 6 never deviate from the transfer paths. For this reason, the conductive balls 6 are surely captured by the vacuum pad 3.

The driving mechanism lifts the sucking head 1 over the array station 4', and moves the sucking head 1 to the space over the semiconductor chip 7 together with the conductive balls 6. The driving mechanism makes the conductive balls 6 aligned with the conductive pads 71, and moves the sucking head 1 downwardly. The conductive balls 6 are brought into contact with the conductive pads 71, respectively. The vacuum is broken. Then, the conductive balls 6 are released from the vacuum pad 3, and are connected to the conductive pads 71, respectively.

As will be understood from the foregoing description, the sucking head 1 and array station 4' confine the conductive balls 6 in the narrow spaces, i.e., the recesses 41 physically separated from one another, and the vacuum source effectively develops vacuum in the narrow spaces 41. The holes 42' are offset from the recesses 41, and make the spherical surfaces of the conductive balls 6 spaced from the holes 42'. The air is blown out from the holes 42', and the conductive balls 6 float over the holes 42'. The conductive balls 6 are effectively attracted to the sucking head without deviation from the narrow spaces 41, and are surely captured by the sucking head 1. Even if the conductive balls 6 are charged, the sucking head 1 and the array station 4 prevent the conductive ball from the influences of the adjacent conductive balls 6. Thus, the conductive balls 6 are surely captured by the sucking head 1.

Figure 4:
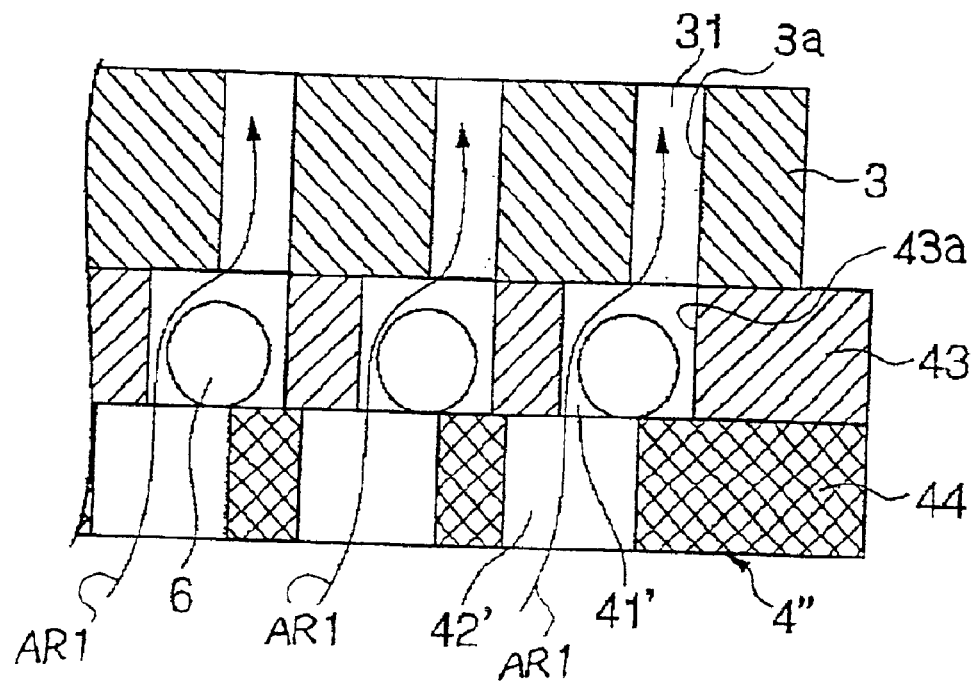
FIG. 4 is a cross sectional view showing airflow in another pallet employable in the transfer apparatus.
Figure 5:
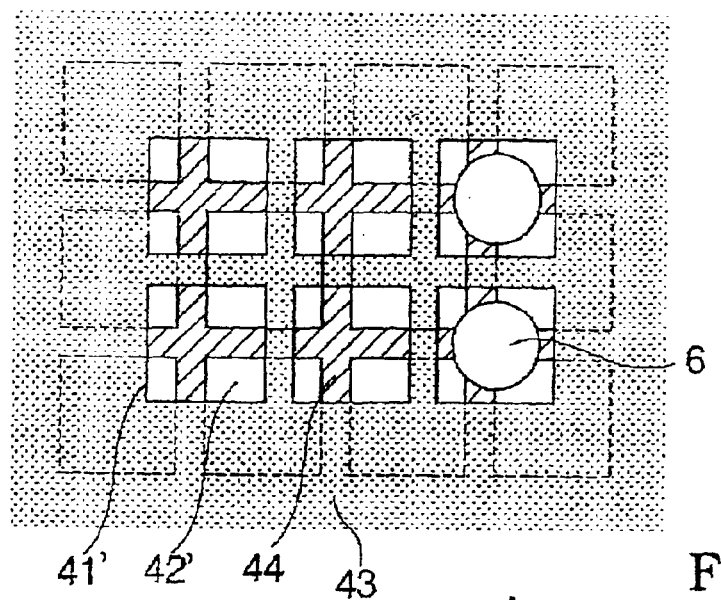
FIG. 5 is a schematic plane view showing recesses and holes formed in the pallet.
Figure 6:
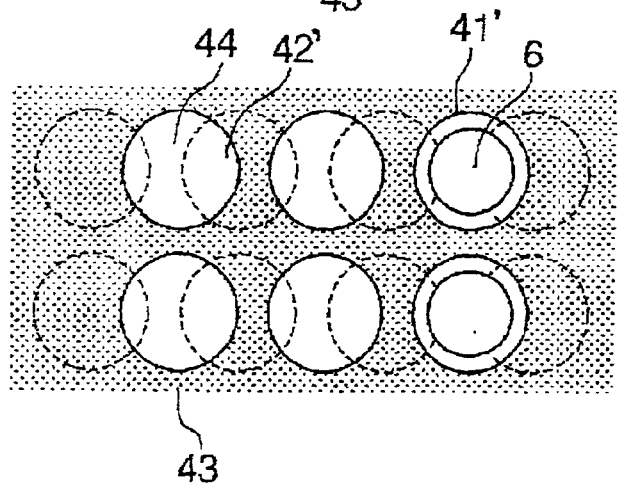
FIG. 6 is a schematic plane view showing recesses and holes employable in yet another pallet.

A pallet 4' may have a two-layered structure 43/44 as shown in FIG. 4. The holes 42' are formed in the lower layer 44, and are offset from the recesses 41' formed in the upper layer 43. The recesses 41' and the holes 42' may have a square cross section (see FIG. 5) or a circular cross section (see FIG. 6). However, it is hard to form the lattices or two arrays of circular holes offset from each other in a single plate. When the manufacturer employs the two-layered structure, the lattices or the arrays of circular holes are separately formed in the upper layer 43 and the lower layer 44, and the upper layer 43 is fixed to the lower layer 44 in the offset manner. Thus, the two-layered structure 43/44 makes the machining step simple and easy. The upper layer 43 may be fixed to the lower layer 44 through a diffusion bonding technique. If the upper layer 43 is adhered to the lower layer 44 by using adhesive compound, the adhesive compound is liable to penetrate into the holes 42', and tends to make the upper layer 43 inclined on the lower layer 44. Thus, the adhesive compound is not preferable.

Using the pallet 4", the transfer operation proceeds as follows. The driving mechanism makes the holes 31 offset from the recesses 41' so as to align the wall 43a with the wall 3a. In this instance, when the vacuum is developed in the recesses 41', the air flows as indicated by arrows AR1. The air flow pushes the conductive balls sideward, and the conductive balls 6 floats along the wall 43. The conductive balls 6 reach the holes 31, and surely captured by the vacuum pad 3. The walls 43a aligned with the walls 3a cause the air to convey the conductive balls 6 to the holes 31. Thus, the walls 43a serve as guide surfaces, and make the conductive balls surely captured by the vacuum pad 3 at the holes 31. If the holes 31 are appropriately offset from the recesses 41' in such a manner that the centerlines of the holes 31 are aligned with the centers of the conductive balls 6 floating along the surface 43a, the conductive balls 6 are surely captured by the vacuum pad 3.

The conductive balls 6 may be arrayed on the pallet 4'/4" in liquid. In the arraying work, the offset arrangement prevents the holes 42' from being stuck with the conductive balls 6. When the pallet 4'/4" is taken out from the liquid, the liquid is smoothly evacuated from the recesses 41 through the holes 42'.

Moreover, while the conductive balls 6 are rolling on the pallet 4'/4", the pallet 4'/4" may be inclined in the liquid. After the conductive balls 6 area arrayed in the recesses 41, the pallet 4'/4" are taken out from the liquid. If the pallet 41/41' is maintained in such a manner that the offset holes 42' are lower than the recesses 41/41', the liquid smoothly flows out from the recesses 41/41'. For example, the pallet 4'/4" is obliquely maintained in a pan, and conductive liquid flows over the pallet 4'/4", and the conductive balls 6 are rolled on the pallet 4'/4" together with the conductive liquid. The conductive balls 6 are dropped into the recesses, and are arrayed. After all of the recesses 41 are filled with the conductive balls 6, the pallet 4'/4" is lifted over the pan. If the pallet 4'/4" keeps the attitude, that is, the offset holes 42' are lower than the recesses 41/41', the conductive liquid smoothly flows out from the recesses 41/41' through the offset holes 42'.

Third Embodiment

FIGS. 3A and 3B show yet another transfer apparatus embodying the present invention. The transfer apparatus implementing the third embodiment also comprises a sucking head 1A, an array station 4A, a driving mechanism (not shown) and a vacuum source (not shown). The transfer apparatus implementing the third embodiment is similar to the transfer apparatus shown in FIGS. 1A to 1C except the sucking head 1A and array station 4A. The driving mechanism and the vacuum source are same as those of the first embodiment, and, for this reason, no further description is incorporated hereinbelow.

The sucking head 1A includes the manifold 2 and a vacuum head 3A. The vacuum head 3A is two-layered structure, and has an upper plate 33 and a lower plate 34. The upper plate 33 is formed with the array of holes 31 same in pattern as the array of conductive pads 71. On the other hand, the lower plate 34 is formed with holes 35, and is fixed to the upper layer 33. Although the holes 35 are laid on the pattern same as that of the conductive pads 71, the holes 35 are larger in diameter than the holes 31. The centerlines of the holes 31 are respectively aligned with the centerlines of the holes 35. In other words, the holes 31 are nested in the holes 35, respectively. In this instance, the holes 31 and holes 35 are separately formed in the upper plate 43 and lower plate 44, and the upper plate 43 is fixed to the lower plate 44. However, the holes 31 and holes 35 may be formed in a single plate. The diffusion bonding is desirable for the vacuum pad 3A, and usage of adhesive compound is less desirable as described in conjunction with the second embodiment. In case where the upper layer 33 and the lower layer 34 are formed of silicon, or in case where the upper and lower layers 33/34 are selectively formed of silicon and glass, the electrostatic bonding is preferable.

The array station 4A also includes a pallet 4B and a manifold 5A. Although the manifold 5A is similar to the manifold 5, the pallet 4B is different from the pallet 4a/4a'. The pallet 4B also has the two-layered structure. The upper layer 43 is formed with plural recesses 41A, which are also open to an upper flat surface of the pallet 4B. The recesses 41A are laid on the pattern same as that of the conductive pads 71 on the semiconductor chip 7, and are to be aligned with the holes 31/35 formed in the vacuum pad 3A. When the conductive balls 6 are put into the recesses 41, the conductive balls 6 are automatically arrayed on the pattern same as the conductive pads 71. However, the recesses 41A have a depth different from that of the recesses 41.

Figure 8:
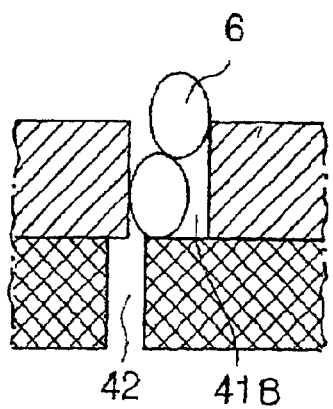
FIG. 8 is a cross sectional view showing conductive balls forced in a recess.

The depth of the recesses 41A ranges from 50% to 110% of the diameter of the conductive balls 6. The recesses 41A fallen within the range are desirable, because the conductive balls 6 are stable in the recesses 41A. Even though the pallet 4B vibrates during the travel onto the manifold 5A, the conductive balls 6 do not jump out from the recesses 41A. It is more preferable that the depth of recesses 41A is equal to or greater than 70% of the diameter of the conductive balls 6 for preventing the conductive balls 6 from jumping out from the recesses 41A. Even when the conductive balls 6 are arrayed in liquid, the recesses in the aforesaid range prevent the conductive balls from jumping out from the recesses 41A at the collision with other conductive balls. The reason for the upper limit, i.e., 110% is that the recesses 41A do not permit more than one conductive balls 6 to be forced into each one. If the recesses 41B are greater than 110%, more than one conductive balls tend to be forced into a single recess 41B (see FIG. 8).

Figure 9:
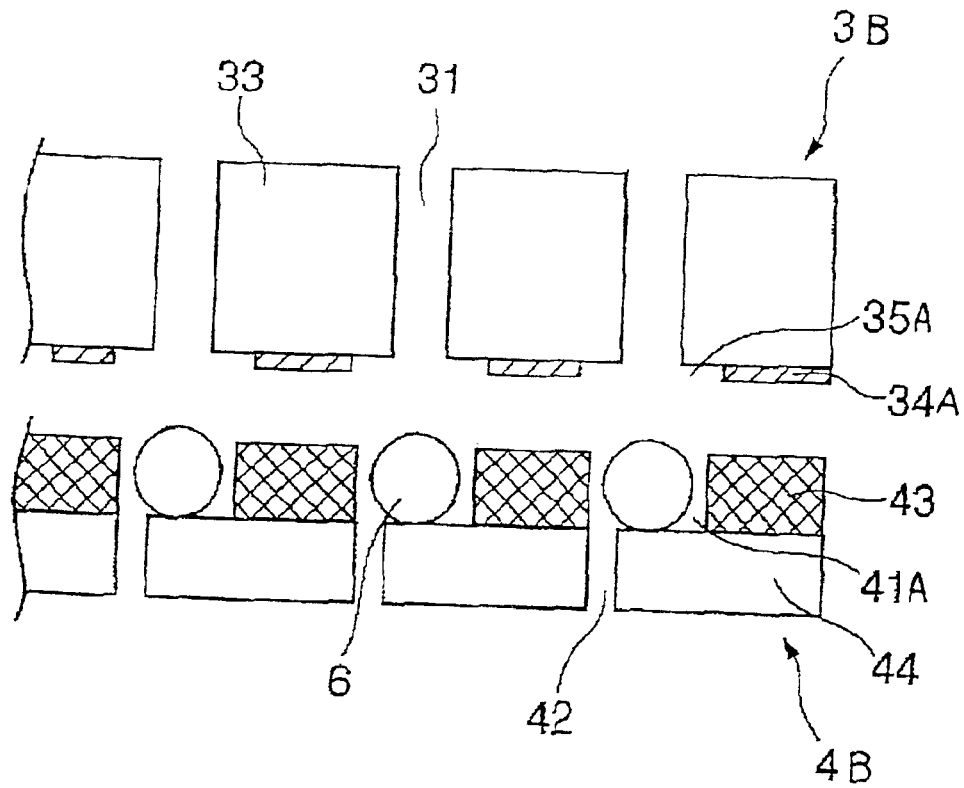
FIGS. 9A and 9B are cross sectional views showing another vacuum pad employable in the transfer apparatus.
Figure 9:
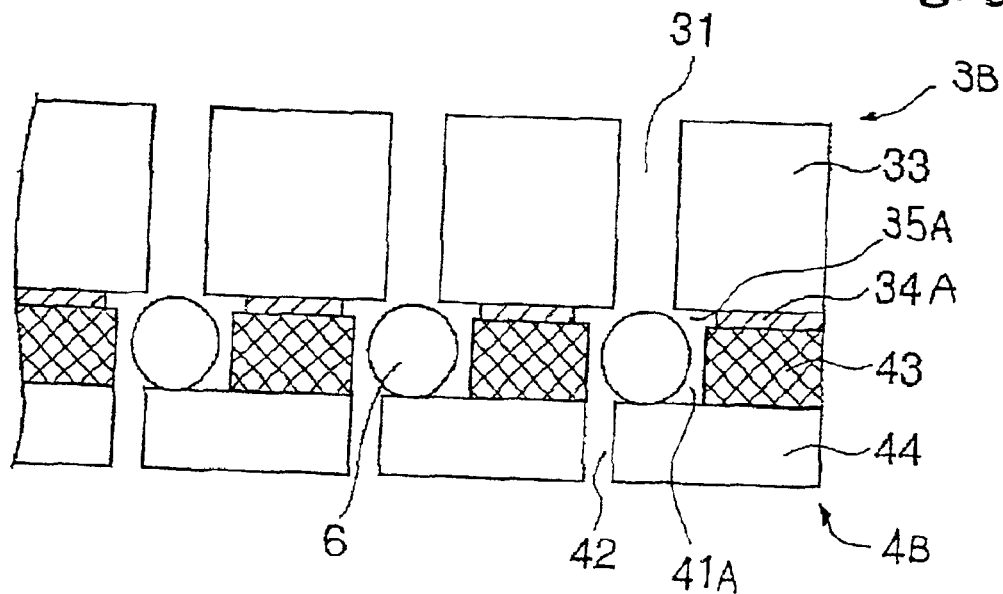

It is more preferable that the recesses 41A have a depth less than 100% of the diameter of the conductive balls 6 from the viewpoint that the conductive balls are appropriately arrayed on the pallet 4B without any excess conductive ball left on the pallet 4B. However, clearance is required for the conductive balls 6. If the depth is less than 100%, the conductive balls 6 project over the upper surface of the pallet 4B. In this situation, if the vacuum head 3 is used, the vacuum head 3 crushes the conductive balls 6 at the abutting engagement with the pallet 4B. In order to prevent the conductive balls 6 from crushing, the wide holes 35 are formed in the vacuum head 3A. The wide holes 35 offer appropriate clearance to the conductive balls 6 so that the vacuum head 3A does not crush the conductive balls 6 (see FIG. 7B). In this instance, the holes 35 are as wide as the recesses 41A. Another vacuum pad 3B has an array of holes 35A wider than the recesses 41A as shown in FIGS. 9A and 9B. The holes 35A offer a margin to the manufacturer. If the holes 35A deviate from target positions, or if the lower plate 34A is not exactly aligned with the upper plate 33, the conductive balls 6 are never crushed.

The thickness of the lower plate 34 is to be appropriately designed. If the lower plate 34 is too thin, the conductive balls 6 are crushed, or rebound on the peripheries of the holes 31. On the other hand, if the lower plate 34 is too thick, the air are sucked into the vacuum pad 3A through the clearance, and the vacuum pad 3A is liable to drop some conductive balls 6. The thickness of the lower plate 34, i.e., the depth of holes 35 are to be fallen within the range between $\{(D/2)+A\}$ and $(D+A)$ where D is the diameter of the conductive balls 6 and A ranges from 10% to 50% of the diameter of the conductive balls 6.

Figure 7:
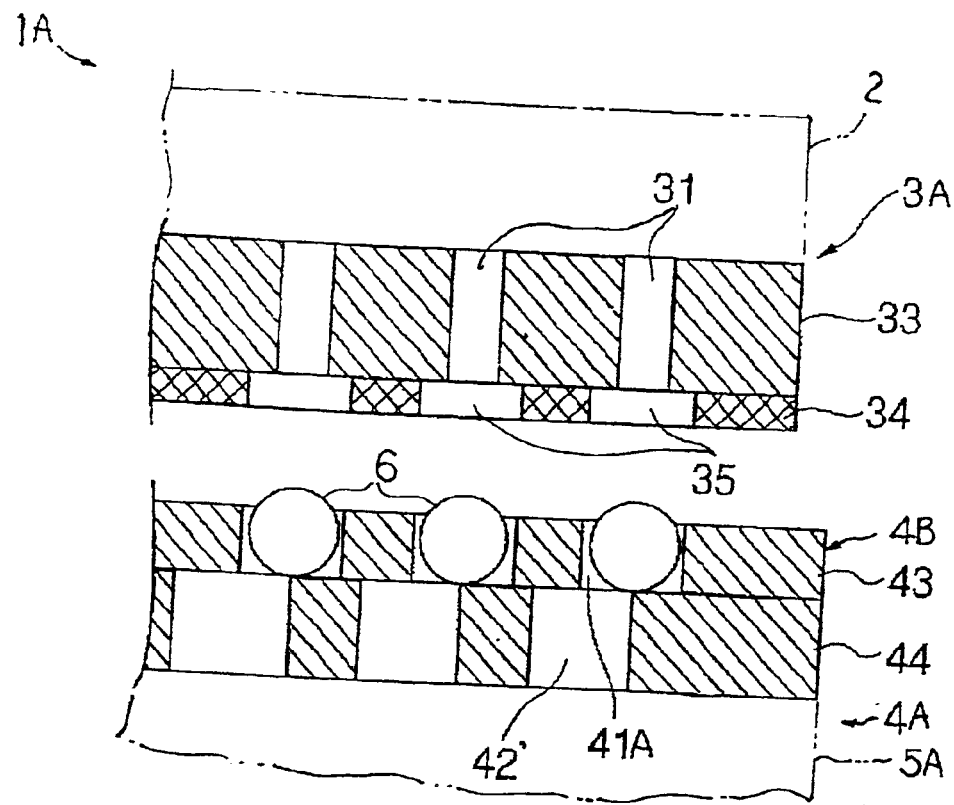
FIGS. 7A and 7B are cross sectional views showing yet another transfer apparatus in a ball transfer operation.
Figure 7:
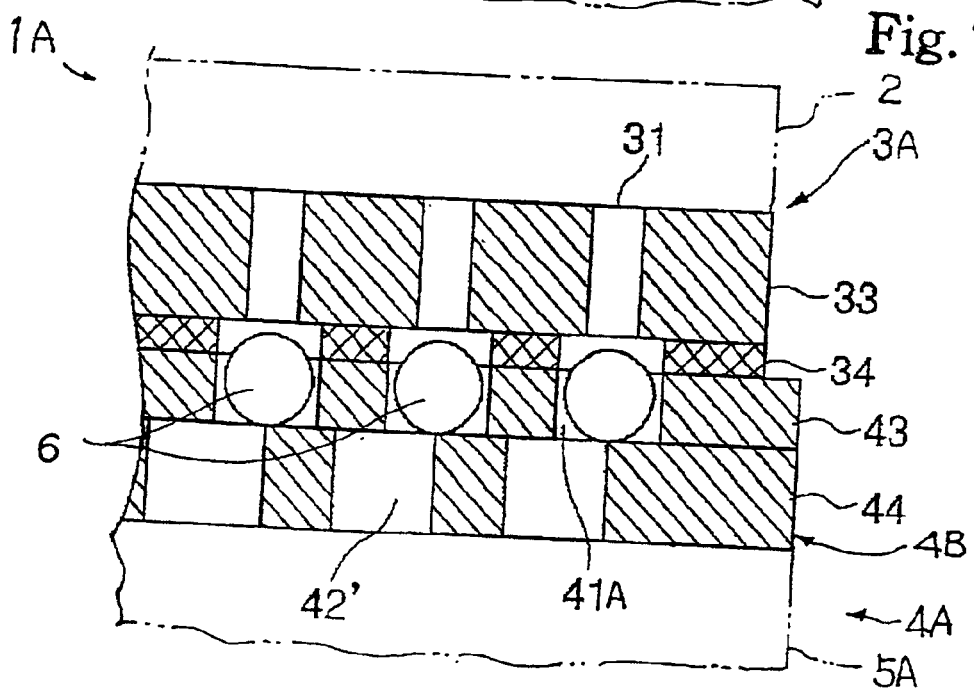

The inventors investigated the most preferable distance between the conductive balls 6 and the lower surface of the upper layer 33 when the vacuum head 3A was held in contact with the pallet 4B (see FIG. 7B). The inventors prepared various samples of the lower plate 34 different in thickness from one another. The inventors confirmed that the most preferable distance was of the order of 30% of the diameter of the conductive balls 6.

Holes 42' are further formed in the lower layer 44 of the pallet 4B, and are open to the bottom surfaces of the recesses 41A, respectively. The recesses 41A are slightly larger in diameter than the conductive balls 6 so as to receive the conductive balls 6. The holes 42' are offset from the associated recesses 41A so that the conductive balls 6 are never dropped into the holes 42'.

The transfer apparatus implementing the third embodiment behaves as similar to the second embodiment, and achieves all the advantages of the first and second embodiments.

Figure 10:
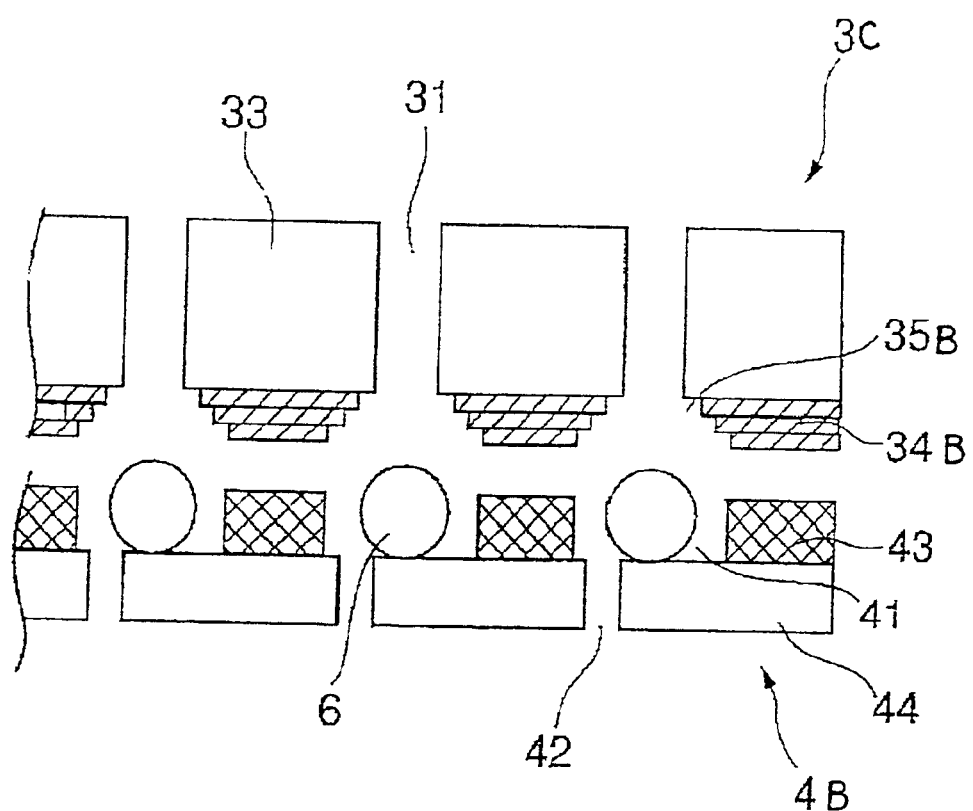
FIG. 10 is a cross sectional view showing yet another vacuum pad employable in the transfer apparatus.

FIG. 10 shows another vacuum pad 3C, with which the manufacturer replaces the vacuum pad 3A. The lower plate 34B has a multiple-layered structure. Arrays of holes are formed in the thin layers, respectively, and holes are stepwise enlarged from the uppermost thin layer to the lowermost thin layer. The arrays of holes are aligned with one another so as to be sequentially nested. When the thin layers are assembled together, the holes 35B have a frusto-conical configuration. The frusto-conical recesses 35B are desirable, because the conductive balls 6 are guided to the holes 31. Even if the driving mechanism fails to make the vacuum pad 3C aligned with the pallet 4B, the conductive balls 6 are automatically aligned with the holes 31 by virtue of the frusto-conical recesses 35B.

Figure 11:
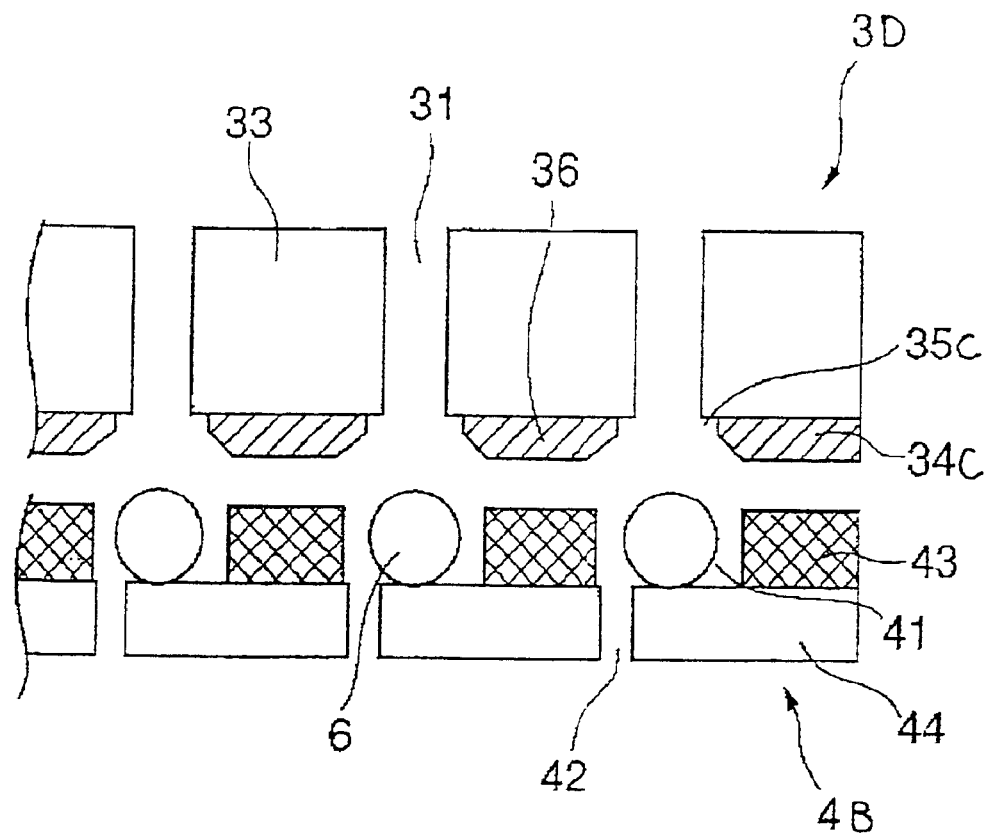
FIGS. 11A and 11B are cross sectional views showing still another vacuum pad employable in the transfer apparatus.
Figure 11:
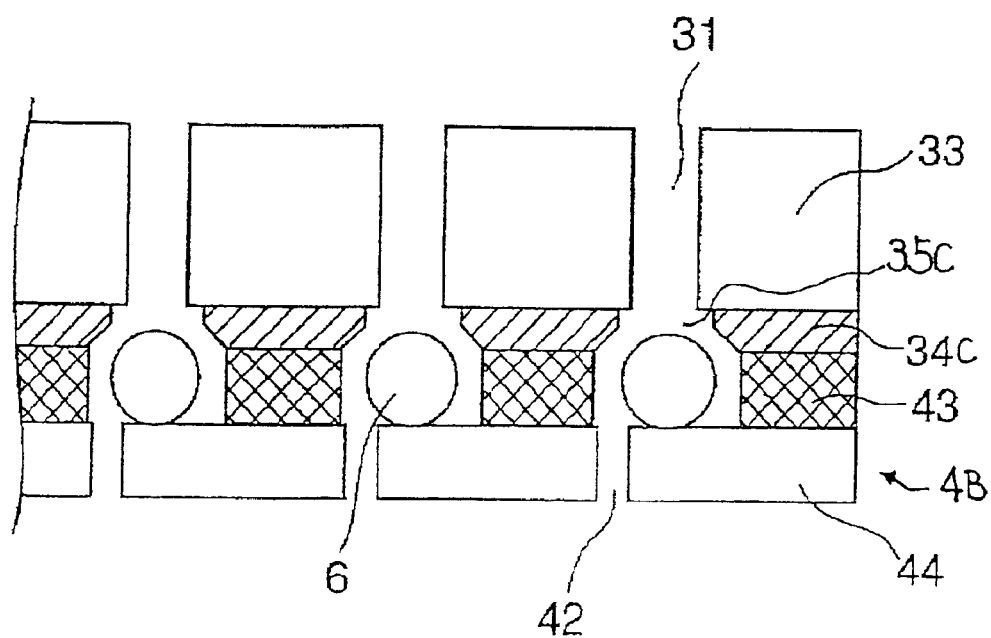

Still another vacuum pad 3D has frusto-conical recesses 35C formed in a single layer 34C of silicon as shown in FIGS. 11A and 11B. The inclined surfaces 36 are created by (111) lattice planes of the silicon crystal. A silicon layer is anisotropically etched for forming the recesses 35C so that the (111) lattice planes are exposed to the recesses 35C. The recesses 35C may be a frustum of regular pyramid.

Yet another vacuum pad 3E has holes 35D defined by rounded surfaces 37. The rounded surfaces 37 are formed through an electroforming process. Otherwise, the rounded surfaces 37 are formed by depositing organic compound. The organic compound may be polyimide, polyamide or polyurea resin. The recesses are firstly formed in the lower layer 34. Subsequently, metal is segregated on the straight surfaces defining the recesses. The metal forms the rounded surfaces 37. In case where the organic compound is used, the recesses are firstly formed in the lower layer 34, and, thereafter, the lower layer 34 is placed in a furnace. Vacuum is developed in the furnace, and precursor of the organic compound is introduced into the furnace. The furnace is heated, and the precursor is polymerized. Then, the surfaces defining the recesses are covered with the polymer so that the rounded surfaces 37 are formed. Of course, the other surfaces are also covered with the polymer. The manufacturer easily controls the thickness of the polymer.

Fourth Embodiment

Figure 13:
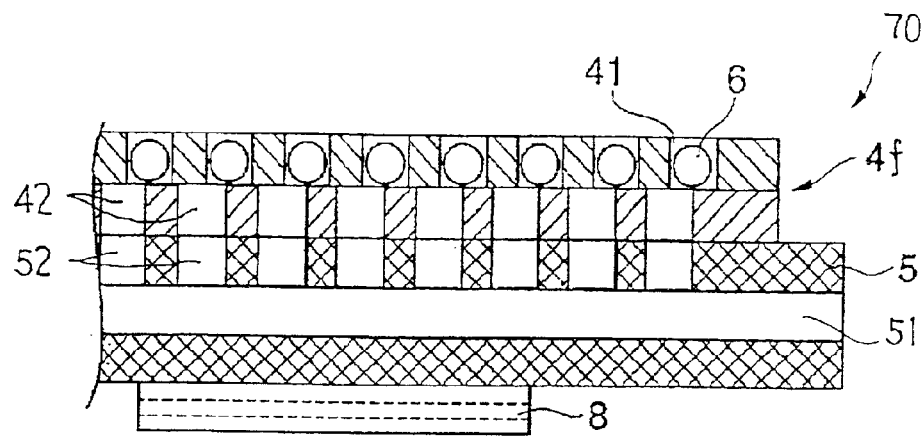
FIG. 13 is a cross sectional view showing the structure of an array station incorporated in yet another transfer apparatus according to the present invention.

FIG. 13 shows an array station 70 incorporated in yet another transfer apparatus embodying the present invention. Although the transfer apparatus implementing the fourth embodiment further comprises a sucking head, vacuum source and a driving mechanism, they are similar in structure to those of the first embodiment, and description is focused on the array station 70 for the sake of simplicity.

The array station 70 includes a pallet 4f, a manifold 5 and a vibrator 8. The pallet 4f and manifold 5 are similar to those of the first embodiment, and no further description is incorporated hereinbelow. The vibrator 8 is attached to the lower surface of the manifold 5. While the vibrator 8 is being driven for vibrations, the vibrations are transferred from the vibrator 8 through the manifold 5 to the pallet 4f. Even if the conductive balls 6 are adhered to the pallet 4f, the conductive balls 6 are separated from the pallet 4f.

In this instance, the vibrator 8 is implemented by a piezoelectric element. However, any vibration source is available for the array station 70 in so far as the vibration source can generate high-frequency small-amplitude vibrations. Mechanical vibrators, ultrasonic vibration generators and motors may be used as the vibrator 8.

The transfer apparatus behaves as follows. First, the conductive balls 6 are put into the recesses 41 of the pallet 4f. The conductive balls 6 are arrayed on the pattern same as the conductive pads on a semiconductor chip. The driving mechanism keeps the sucking head over the catching position. The conductive balls 6 arrayed in the pallet 4f are conveyed onto the manifold 5, and the holes 42 are aligned with the holes 52. The air fills the hollow space 51, holes 52/42 and the recesses 41.

Subsequently, the driving mechanism moves the sucking head downwardly, and the vacuum pad is brought into surface-to-surface contact with the pallet 4f, and the holes formed in the vacuum pad are respectively connected to the recesses 41. Thus, the conductive balls 6 are confined in the narrow spaces, i.e., the recesses 41, respectively. The walls, which define the recesses 41, isolate the conductive balls from one another, and make the narrow spaces independent of one another. The narrow spaces offer transfer paths to the conductive balls 6, and the walls do not permit the conductive balls 6 to deviate form the transfer paths. The vibrator 8 is driven for vibrations, and the makes the conductive balls separated from the pallet 4f, if any.

Subsequently, the vacuum source is connected to the sucking head, and, accordingly, vacuum is developed through the sucking head in the recesses 41. The conductive balls 6 are attracted to the vacuum pad, and are captured. The vibrator 8 may be continuously driven for rotation until the conductive balls 6 are captured by the vacuum pad. Even if electrostatic force is exerted on the adjacent conductive balls 6, the conductive balls 6 never deviate from the transfer paths. For this reason, the conductive balls 6 are surely captured by the vacuum pad.

The driving mechanism lifts the sucking head over the array station 4f, and moves the sucking head to the space over the semiconductor chip together with the conductive balls 6. The driving mechanism makes the conductive balls 6 aligned with the conductive pads, and moves the sucking head downwardly. The conductive balls 6 are brought into contact with the conductive pads, respectively. The vacuum is broken. Then, the conductive balls 6 are released from the vacuum pad, and are connected to the conductive pads, respectively.

The transfer apparatus implementing the fourth embodiment achieves all advantageous of the first embodiment. Moreover, the vibrator 8 is effective against the conductive balls 6 adhered to the pallet 4f.

Fifth Embodiment

Figure 14:
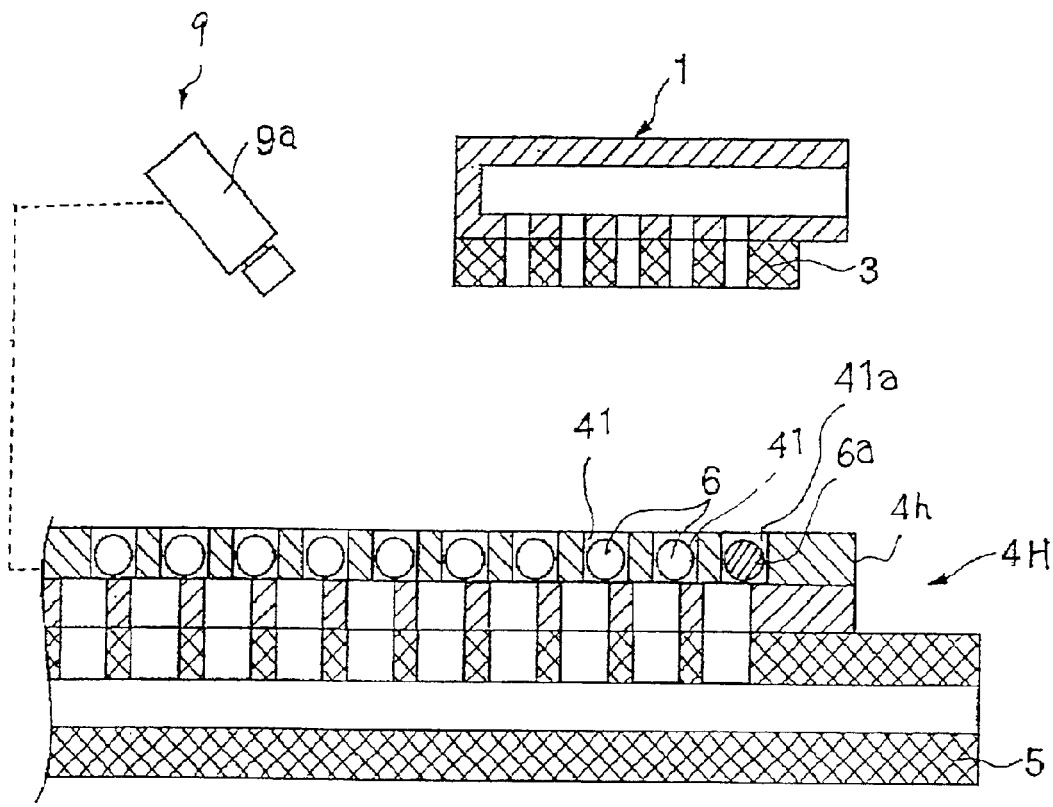
FIG. 14 is a cross sectional view showing the structure of still another transfer apparatus according to the present invention.

FIG. 14 shows still another transfer apparatus embodying the present invention. The transfer apparatus implementing the fifth embodiment comprises a sucking head 1, an array station 4H, a vacuum source (not shown), a driving mechanism (not shown) and a monitor system 9. The sucking head 1, the vacuum source and the driving mechanism are similar to those of the first embodiment, and detailed description is omitted for the sake of simplicity.

The monitor system 9 cooperates with the array station 4H so as to transfer a complete array of conductive balls 6 to a semiconductor chip. In detail, the monitor system 9 has an image pick-up device 9a, and the image pick-up device 9a is directed to the pallet 4h in the catching position. The image is transferred from the image pick-up device 9a to a controller (not shown), and the controller checks the image to see whether or not all the recesses 41 in the catching position are filled with the conductive balls 6. If the answer is positive, the driving mechanism moves the sucking head 1 downwardly, and the conductive balls 6 are captured by the vacuum pad 3. On the other hand, when the answer is negative, the controller instructs the array station to advance the pallet 4h until a complete array of conductive balls 6 reaches the catching position.

The pallet 4h is assumed to fail to receive the conductive ball 6a in the recess 41. When the vacant recess 41a enters the catching position, the monitor system 9 notices the recess 41a vacant. The monitor system 9 instructs the array station 4H to advance the pallet 4h until the vacant recess 41a is moved out of the catching position. When the recess 41a is moved out of the catching position, the monitor system 9 confirms that a complete array of conductive balls 6 is in the catching position. Then, the monitor system 9 permits the driving mechanism to move the sucking head 1 onto the pallet 4h.

The transfer apparatus implementing the fifth embodiment achieves all the advantages of the first embodiment, and enhances the production yield of the semiconductor chip by previously eliminating the incomplete array of conductive balls from the catching position.

As will be appreciated from the foregoing description, the sucking head and the pallet confine the conductive bumps in the paths physically separated from one another, and the vacuum attracts the conductive bumps to the sucking head. Even if the conductive bumps have been charged, the charged conductive bumps in the adjacent paths are never influential to one another. For this reason, the conductive bumps are surely captured by the sucking head.

Sixth Embodiment

Figure 15A:
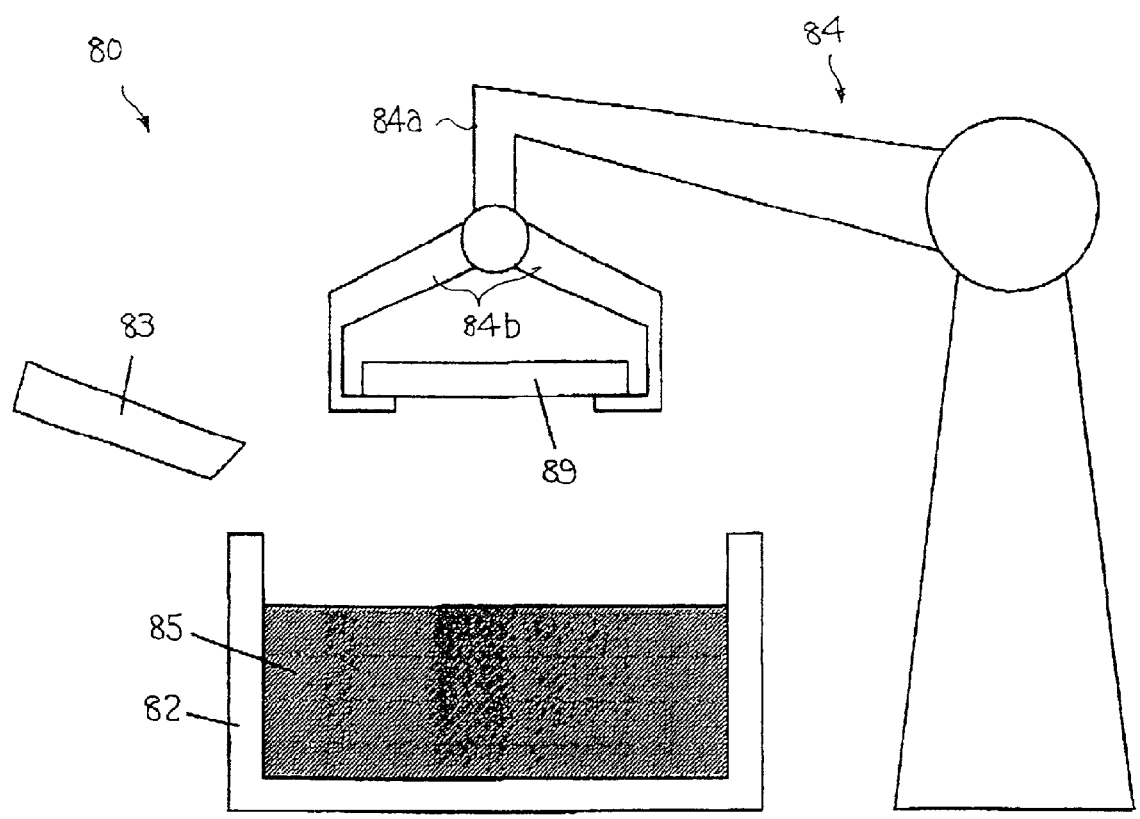
FIGS. 15A to 15C are schematic views showing a ball transfer sequence according to the present invention.
Figure 15B:
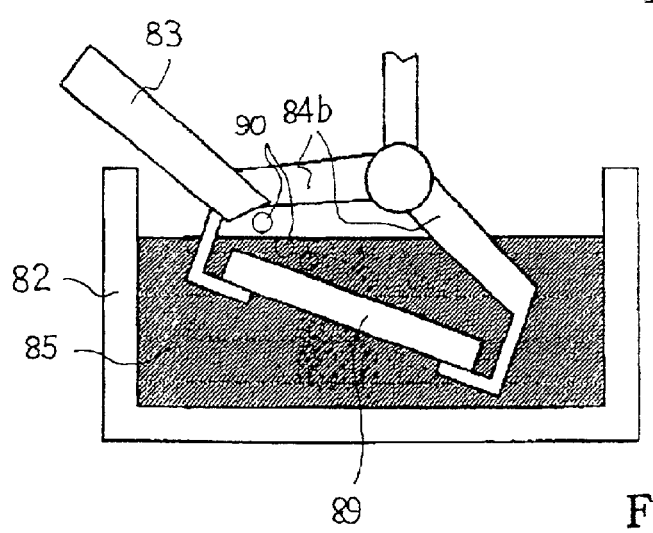
Figure 15C:
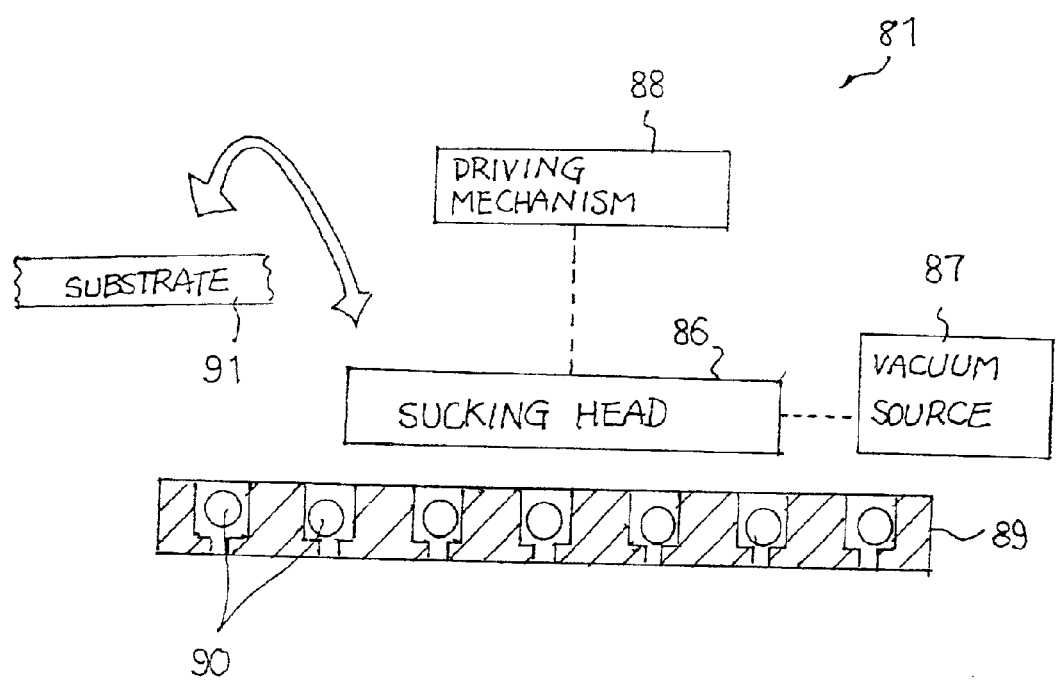

FIGS. 15A to 15C show a ball transfer sequence using a ball transfer system embodying the present invention. The ball transfer system embodying the present invention is broken down into a ball arraying apparatus 80 and a ball transfer apparatus 81. The ball arraying apparatus 80 includes a bath 82, a ball feeder 83 and a pallet conveying unit 84. The bath 82 is filled with electrolyte 85, and the electrolyte contains lower alcohol such as, for example, methanol, ethanol, propanol, dispersant and water. The ball feeder 83 projects into the space over the bath 82, and the pallet conveying unit 84 has a movable arm 84a and movable fingers 84b at the leading end of the movable arm 84a.

On the other hand, the ball transfer apparatus 81 includes a sucking head 86, a vacuum source 87 and a driving mechanism 88. The transfer apparatus 81 is similar in construction to the prior art transfer apparatus. Of course, the transfer apparatus 81 is replaceable with any one of the transfer apparatus according to the present invention.

The ball transfer sequence starts with grasping a pallet 89 with the fingers 84b. The pallet conveying unit 84 moves the pallet 89 over the bath 82 as shown in FIG. 15A. The pallet conveying unit 84 aligns the pallet 89 with a loading position.

Subsequently, the moving arm 84 downwardly moves the pallet 89, and dips the pallet 89 into the electrolyte 85. When the pallet 89 reaches the loading position in the vicinity of the ball loader 83, the fingers 84b incline the pallet 89 in the electrolyte 85, and the ball feeder 83 supplies conductive balls 90 onto the pallet 89 as shown in FIG. 15B. Even if the conductive balls 90 are charged, the electric charges are eliminated from the conductive balls 90 in the electrolyte 85. The pallet 89 is formed with an array of recesses, and the array of recesses is identical in pattern with an array of pads on a substrate 91. Thus, the conductive balls 90 are arrayed on the pallet 89.

The pallet conveying unit 84 moves the pallet 89 filled with the conductive balls 90 to the ball transfer apparatus 81, and the ball transfer apparatus 81 transfers the conductive balls 90 to the substrate 91.

As will be understood from the foregoing description, the conductive balls 90 are arrayed in the electrolyte 85, and the electric charges are eliminated from the conductive balls 90 during the arraying. For this reason, although the sucking head 86 is spaced from the pallet 89, i.e., the trajectories of conductive balls are not separated from one another, the conductive balls 90 are never attracted to one another during the travel from the pallet 89 to the sucking head 86. Thus, the ball transfer system does not fail to array the conductive balls 90 on the substrate 91.

Seventh Embodiment

Figure 16A:
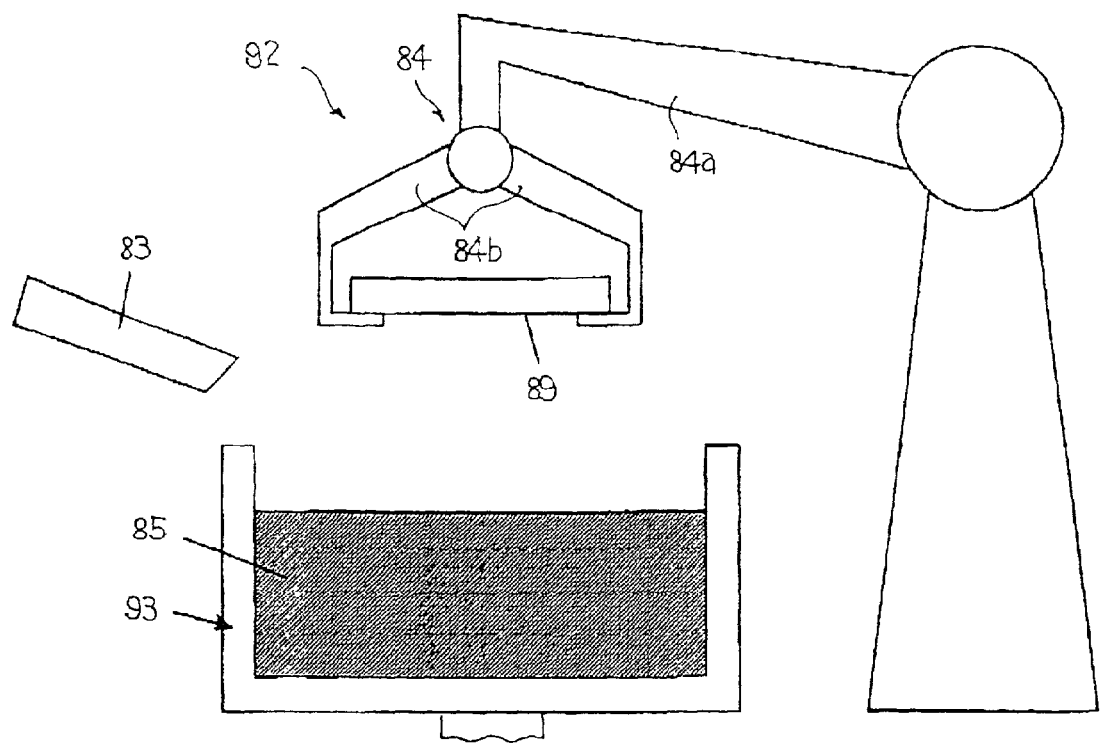
FIGS. 16A and 16B are schematic views showing another ball transfer sequence according to the present invention.
Figure 16B:
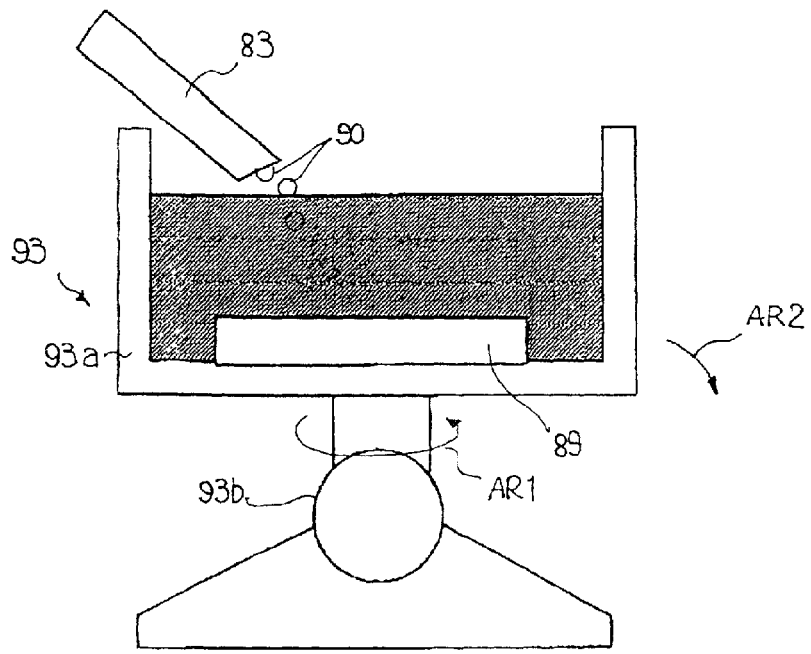

FIGS. 16A and 16B show another ball arraying apparatus 92 embodying the present invention. The ball arraying apparatus 92 includes the pallet conveying unit 84, the ball feeder 83 and a rotatable bath 93. The pallet conveying unit 84 and the ball feeder 83 are similar to those of the sixth embodiment, and no further description is incorporated hereinbelow.

The rotatable bath 93 includes a bath 93a filled with the electrolyte 85 and a driving mechanism 93b. The driving mechanism 93b drives the bath 93a for rotation as indicated by arrow AR1. Otherwise, the driving mechanism 93b inclines the bath 93a as indicated by arrow AR2.

The ball transfer sequences is similar to that of the sixth embodiment until the pallet 89 is aligned with the loading position. The pallet conveying unit 84 places the pallet 89 on the bottom surface of the bath 93a. The ball feeder 83 supplies the conductive balls 90 onto the central area of the pallet 89, and the driving mechanism 93b gives rise to rotation of the bath 93a. The centrifugal force is exerted to the conductive balls 90, and are dispersed over the pallet 89. As a result, the conductive balls 90 are dropped into the recesses, and are arrayed. The electrolyte 85 eliminates the electric charges from the conductive balls 90 as similar to that of the sixth embodiment.

The pallet conveying unit 84 moves the pallet 89 to the ball transfer apparatus 81, and the ball transfer apparatus 81 transfers the conductive balls 90 onto the substrate 91.

Eighth Embodiment

Figure 17:
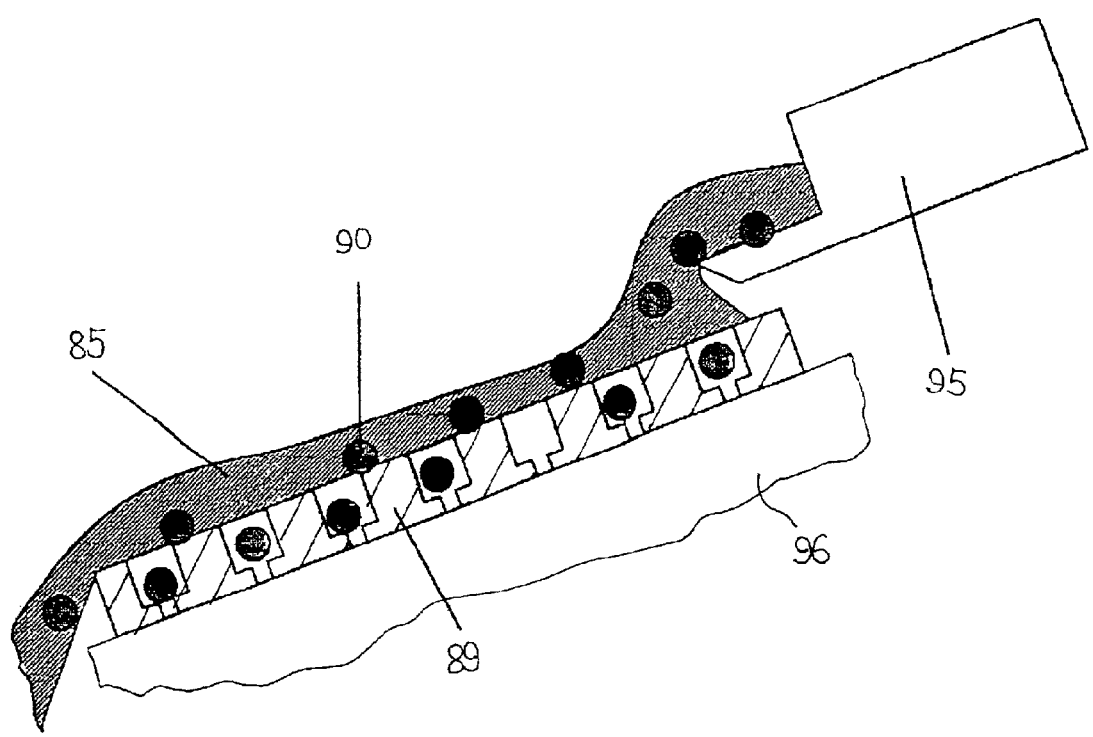
FIG. 17 is a schematic view showing yet another ball transfer operation according to the present invention.

FIG. 17 shows a feeder 95 and a pallet table 96 both forming parts of yet another ball arraying apparatus embodying the present invention. Although the ball arraying apparatus implementing the eighth embodiment further includes a pallet conveying unit, the pallet conveying unit is similar to that of any one of the ball arraying apparatus, and description is omitted for the sake of simplicity.

Though not shown in FIG. 17, a driving mechanism is associated with the pallet table 96, and makes the pallet table 96 inclined as shown. The feeder 95 supplies the conductive balls 90 onto the pallet 89 together with the electrolyte 85. The conductive balls 90 are dropped into the recesses, and are arrayed. The other features are similar to those of the sixth and seventh embodiments.

Figure 18:
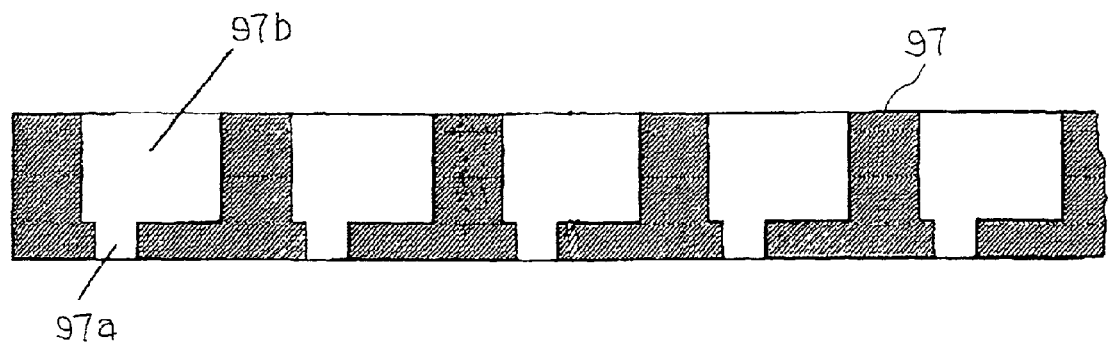
FIG. 18 is a cross sectional view showing the structure of a pallet used in the ball transfers.
Figure 19:
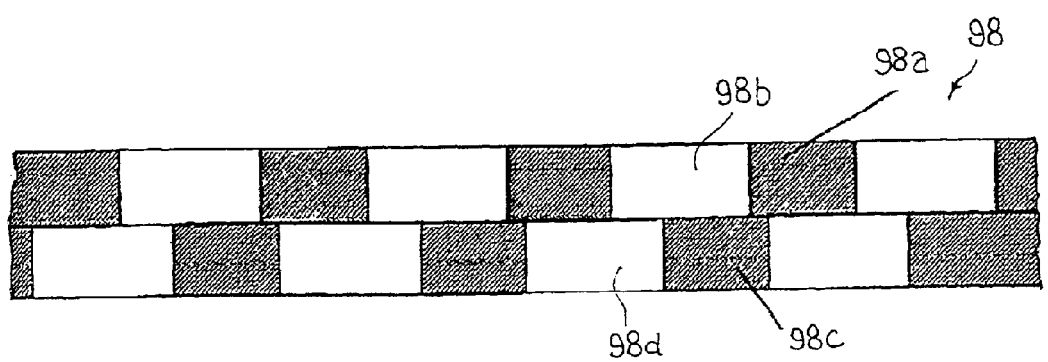
FIG. 19 is a cross sectional view showing the structure of another pallet used in the ball transfers.
Figure 20:
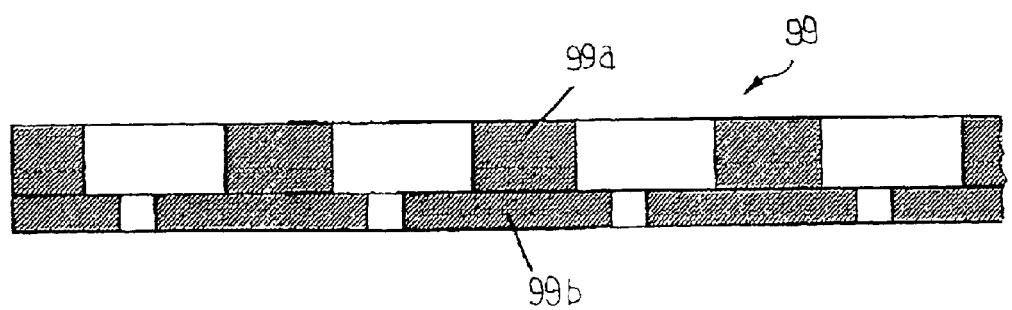
FIG. 20 is a cross sectional view showing the structure of a pallet used in the ball transfers.

FIGS. 18 to 20 show pallets 97, 98 and 99 available for the ball arraying apparatus. The pallet 97 has air holes 97a offset from the associated recesses 97b. The pallet 98 has two-layered structure. The upper layer 98a is formed with recesses 98b, and the lower layer 98c is formed with air holes 98d. The upper layer 98a and the lower layer 98c are assembled together in such a manner that the air holes 98d are offset from the recesses 98b.

The pallet 99 is similar in structure to the pallet 98, and has the two-layered structure 99a/99b. The upper layer 99a is fixed to the lower layer 99b through a diffusion bonding.

Although several embodiments of the present invention have been shown and described, it will be apparent to those skilled in the art that various changes and modifications may be made without departing from the spirit and scope of the present invention.

What is claimed is:

1. A transfer apparatus for transferring conductive bumps to an array of conductive pads on a substrate, comprising:
    a sucking head having plural vacuum holes laid on a pattern same as a pattern of said array of conductive pads;
    a vacuum source developing vacuum in said plural vacuum holes, and breaking said vacuum;
    an array station having a pallet formed with plural recesses laid on said pattern of said array of conductive pads, and receiving said conductive bumps, respectively; and
    a driving mechanism moving said sucking head to said pallet so as to form paths physically separated from one another for guiding said conductive bumps from said plural recesses to said plural vacuum holes, and further moving said sucking head from said pallet to said array of conductive pads, wherein said pallet includes holes associated with said plural recesses, said holes being offset from said plural recesses.

2. The transfer apparatus as set forth in claim 1, in which said array station is further formed with an air passage connected to said recesses for supplying the air thereto when said vacuum source develops vacuum in said paths through said plural vacuum holes.

3. The transfer apparatus as set forth in claim 2, in which said air passage has a hollow space open to the air, and plural air holes respectively associated with said plural recesses and connected between said hollow space and the associated recesses.

4. A transfer apparatus for transferring conductive bumps to an array of conductive pads on a substrate, comprising:
    a sucking head having plural vacuum holes laid on a pattern same as a pattern of said array of conductive pads;
    a vacuum source developing vacuum in said plural vacuum holes, and breaking said vacuum;
    an array station having a pallet formed with plural recesses laid on said pattern of said array of conductive pads, and receiving said conductive bumps, respectively; and
    a driving mechanism moving said sucking head to said pallet so as to form paths physically separated from one another for guiding said conductive bumps from said plural recesses to said plural vacuum holes, and further moving said sucking head from said pallet to said array of conductive pads;
    wherein said array station is further formed with an air passage connected to said recesses for supplying the air thereto when said vacuum source develops vacuum in said paths through said plural vacuum holes;
    wherein said air passage has a hollow space open to the air, and plural air holes respectively associated with said plural recesses and connected between said hollow space and the associated recesses and wherein said plural air holes are offset from said associated recesses, respectively.

5. The transfer apparatus as set forth in claim 4, in which said array station includes a first plate formed with said plural air holes and a second plate formed with said plural recesses and connected to said first plate.

6. The transfer apparatus as set forth in claim 5, in which said first plate is merged with said second plate by a diffusion bonding.

7. The transfer apparatus as set forth in claim 1, in which said conductive bumps have a spherical configuration, and said plural recesses have a depth fallen within a range from 50% to 110% of a diameter of said conductive bumps.

8. A transfer apparatus for transferring conductive bumps to an array of conductive pads on a substrate, comprising:
a sucking head having plural vacuum holes laid on a pattern same as a pattern of said array of conductive pads;
a vacuum source developing vacuum in said plural vacuum holes, and breaking said vacuum;
an array station having a pallet formed with plural recesses laid on said pattern of said array of conductive pads, and receiving said conductive bumps, respectively; and
a driving mechanism moving said sucking head to said pallet so as to form paths physically separated from one another for guiding said conductive bumps from said plural recesses to said plural vacuum holes, and further moving said sucking head from said pallet to said array of conductive pads;
wherein said conductive bumps have a spherical configuration, and said plural recesses have a depth fallen within a range from 50% to 110% of a diameter of said conductive bumps and wherein said plural recesses are connected through plural air holes to the air, and said plural air holes are offset from the associated recesses.

9. The transfer apparatus as set forth in claim 7, in which said depth is smaller in value than said diameter of said conductive bumps, and said plural vacuum holes have respective sucking ports larger in area than cross sections of said conductive bumps coplanar with an upper surface of said pallet.

10. The transfer apparatus as set forth in claim 9, in which said sucking head has a first plate formed with said sucking ports and a second plate formed with remaining portions of said plural vacuum holes and fixed to said first plate.

11. The transfer apparatus as set forth in claim 10, in which said first plate is merged with said second plate by a diffusion bonding.

12. The transfer apparatus as set forth in claim 10, in which said sucking ports are defined by inner surfaces inclined with respect to a surface of said first plate where said sucking ports are open so that said sucking ports are reduced in area from said surface toward said remaining portions.

13. The transfer apparatus as set forth in claim 12, in which said sucking ports are formed in a silicon layer.

14. A transfer apparatus for transferring conductive bumps to an array of conductive pads on a substrate, comprising:
a sucking head having plural vacuum holes laid on a pattern same as a pattern of said array of conductive pads;
a vacuum source developing vacuum in said plural vacuum holes, and breaking said vacuum;
an array station having a pallet formed with plural recesses laid on said pattern of said array of conductive pads, and receiving said conductive bumps, respectively; and
a driving mechanism moving said sucking head to said pallet so as to form paths physically separated from one another for guiding said conductive bumps from said plural recesses to said plural vacuum holes, and further moving said sucking head from said pallet to said array of conductive pads, wherein said conductive bumps have a spherical configuration, and said plural recesses have a depth fallen within a range from 50% to 110% of a diameter of said conductive bumps and wherein said depth is smaller in value than said diameter of said conductive bumps, and said plural vacuum holes have respective sucking ports larger in area than cross sections of said conductive bumps coplanar with an upper surface of said pallet and wherein said sucking head has a first plate formed with said sucking ports and a second plate formed with remaining portions of said plural vacuum holes and fixed to said first plate and wherein said sucking ports are defined by inner surfaces inclined with respect to a surface of said first plate where said sucking ports are open so that said sucking ports are reduced in area from said surface toward said remaining portions and wherein said sucking ports are formed in a silicon layer and wherein said inner surfaces are (111) lattice planes of the silicon crystal.

15. The transfer apparatus as set forth in claim 12, in which said inner surfaces are rounded.

16. The transfer apparatus as set forth in claim 15, in which said inner surfaces are formed in a metallic layer formed on said first plate by an electroforming.

17. A transfer apparatus for transferring conductive bumps to an array of conductive pads on a substrate, comprising:
a sucking head having plural vacuum holes laid on a pattern same as a pattern of said array of conductive pads;
a vacuum source developing vacuum in said plural vacuum holes, and breaking said vacuum;
an array station having a pallet formed with plural recesses laid on said pattern of said array of conductive pads, and receiving said conductive bumps, respectively; and
a driving mechanism moving said sucking head to said pallet so as to form paths physically separated from one another for guiding said conductive bumps from said plural recesses to said plural vacuum holes, and further moving said sucking head from said pallet to said array of conductive pads;
wherein said conductive bumps have a spherical configuration, and said plural recesses have a depth fallen within a range from 50% to 110% of a diameter of said conductive bumps and wherein said depth is smaller in value than said diameter of said conductive bumps, and said plural vacuum holes have respective sucking ports larger in area than cross sections of said conductive bumps coplanar with an upper surface of said pallet and wherein said sucking head has a first plate formed with said sucking ports and a second plate formed with remaining portions of said plural vacuum holes and fixed to said first plate and wherein said sucking ports are defined by inner surfaces inclined with respect to a surface of said first plate where said sucking ports are open so that said sucking ports are reduced in area from said surface toward said remaining portions and wherein said inner surfaces are rounded and wherein said inner surfaces are formed in an organic compound layer.

18. The transfer apparatus as set forth in claim 17, in which said organic compound layer is formed of at least one substance selected from the group consisting of polyimide, polyamide and polyurea resin.

19. The transfer apparatus as set forth in claim 1, in which said array station further includes a vibrator driven for vibrations so as to vibrate said conductive bumps received in said pallet.

20. The transfer apparatus as set forth in claim 19, in which said vibrator is a piezoelectric element.

21. The transfer apparatus as set forth in claim 1, further comprising a monitoring system monitoring said pallet to see whether or not said conductive bumps are respectively received in the recesses of an array corresponding to said array of conductive pads, and instructing said array station to move said pallet for assigning another array of recesses respectively filled with said conductive bumps to said sucking head with the negative answer and said driving mechanism to capture said conductive bumps by said sucking head with the positive answer.

22. The transfer apparatus as set forth in claim 21, in which said monitoring system includes an image pick-up device directed to said pallet, and said monitoring system gives instructions selectively to said array station and said driving mechanism through a data processing on the image supplied from said image pick-up device.

23. The transfer apparatus as set forth in claim 1, in which said conductive bumps are received in said plural recesses in the presence of liquid.

24. The transfer apparatus as set forth in claim 23, in which said array station is further formed with a drain passage connected to said recesses for flowing out said liquid after said conductive bumps are received in said plural recesses, respectively.

25. The transfer apparatus as set forth in claim 24, in which said drain passage has a hollow space and plural drain holes respectively associated with said plural recesses and connected between said hollow space and the associated recesses.

26. A transfer apparatus for transferring conductive bumps to an array of conductive pads on a substrate, comprising:

a sucking head having plural vacuum holes laid on a pattern same as a pattern of said array of conductive pads;

a vacuum source developing vacuum in said plural vacuum holes, and breaking said vacuum;

an array station having a pallet formed with plural recesses laid on said pattern of said array of conductive pads, and receiving said conductive bumps, respectively; and a driving mechanism moving said sucking head to said pallet so as to form paths physically separated from one another for guiding said conductive bumps from said plural recesses to said plural vacuum holes, and further moving said sucking head from said pallet to said array of conductive pads, wherein said conductive bumps are received in said plural recesses in the presence of liquid, wherein said array station is further formed with a drain passage connected to said recesses for flowing out said liquid after said conductive bumps are received in said plural recesses, respectively, and wherein said drain passage has a hollow space and plural drain holes respectively associated with said plural recesses and connected between said hollow space and the associated recesses and wherein said plural drain holes are offset from said associated recesses, respectively.

27. A ball transfer system, comprising:

a ball arraying apparatus for arraying conductive balls in an array of recesses formed in a pallet in the presence of electrolyte, said array of recesses being laid on a pattern identical with a pattern of conductive pads formed on a substrate, a ball transfer apparatus for transferring said conductive balls from said recesses to said array of pads on said substrate, wherein said pallet includes holes associated with said array of recesses, said holes being offset from said array of recesses, a bath filled with said electrolyte and driven for rotation, a pallet conveying unit dipping said pallet in said electrolyte and moving said pallet from said bath to said ball transfer apparatus, and a ball feeder provided over said bath and feeding said conductive balls onto said pallet while said bath is being driven for rotation.

28. A ball arraying apparatus, comprising:

a pallet formed with plural recesses laid on a pattern of an array of conductive pads on a target plate, open to a surface thereof and receiving conductive bumps, respectively, a means for supplying electrolyte to said pallet so that said electrolyte flows over said surface, and a means for supplying said conductive balls onto said surface so that said conductive balls are moved on said surface together with said electrolyte, wherein said pallet is further formed with a drain passage connected to said recesses for flowing out said liquid after said conductive bumps are received in said plural recesses, respectively, and wherein said drain passage has a hollow space and plural drain holes respectively associated with said plural recesses and connected between said hollow space and the associated recesses and wherein said plural drain holes are offset from said associated recesses, respectively.

29. A ball arraying apparatus, comprising:

a pallet formed with plural recesses laid on a pattern of an array of conductive pads on a target plate, open to a surface thereof and receiving conductive bumps, respectively, a means for supplying electrolyte to said pallet so that said electrolyte flows over said surface, and a means for supplying said conductive balls onto said surface so that said conductive balls are moved on said surface together with said electrolyte, wherein said pallet is further formed with boles offset from said recesses so as to permit said electrolyte to flow out therethrough, wherein said pallet includes a first plate formed with said recesses and a second plate formed with said holes and bonded to said first plate.

30. The ball arraying apparatus as set forth in claim 29, in which said first plate is bonded to said second plate through a diffusion bonding.

* * * * *